(12) United States Patent
Yamamoto

(10) Patent No.: US 12,027,119 B2
(45) Date of Patent: Jul. 2, 2024

(54) DISPLAY DEVICE AND METHOD FOR DRIVING SAME

(71) Applicant: Sharp Kabushiki Kaisha, Sakai (JP)

(72) Inventor: Kaoru Yamamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 2 days.

(21) Appl. No.: 17/797,493

(22) PCT Filed: Feb. 14, 2020

(86) PCT No.: PCT/JP2020/005768
§ 371 (c)(1),
(2) Date: Aug. 4, 2022

(87) PCT Pub. No.: WO2021/161505
PCT Pub. Date: Aug. 19, 2021

(65) Prior Publication Data
US 2023/0057970 A1     Feb. 23, 2023

(51) Int. Cl.
*G09G 3/3233*     (2016.01)

(52) U.S. Cl.
CPC ... *G09G 3/3233* (2013.01); *G09G 2300/0828* (2013.01); *G09G 2300/0842* (2013.01); *G09G 2310/0286* (2013.01); *G09G 2310/08* (2013.01); *G09G 2330/021* (2013.01)

(58) Field of Classification Search
CPC ......... G09G 3/3233; G09G 2300/0828; G09G 2300/0842; G09G 2310/0286; G09G 2310/08; G09G 2330/021; G09G 3/2096; G09G 3/3283; G09G 2230/00; G09G 2310/0216; G09G 2320/0295;
(Continued)

(56) References Cited

U.S. PATENT DOCUMENTS

| 2014/0023173 A1 | 1/2014 | Miyake |
| 2016/0351160 A1 | 12/2016 | In et al. |
| 2017/0186373 A1 | 6/2017 | Nishikawa et al. |

(Continued)

FOREIGN PATENT DOCUMENTS

| JP | 2014-039247 A | 2/2014 |
| WO | 2015/190407 A1 | 12/2015 |

OTHER PUBLICATIONS

Official Communication issued in International Patent Application No. PCT/JP2020/005768, mailed on Apr. 21, 2020.

*Primary Examiner* — Adam R. Giesy
(74) *Attorney, Agent, or Firm* — Keating & Bennett, LLP

(57) ABSTRACT

In a display device having an external compensation function, a decrease in compensation accuracy caused by coupling noise generated in a data signal line is prevented. An emission driver that applies a light-emission control signal (EM) to each of a plurality of light-emission control lines includes a shift register formed of a plurality of unit circuits. The shift register generates a light-emission control signal (EM) to be applied to each light-emission control line on the basis of a plurality of light-emission control clock signals (ECK1 to ECK4) outputted from a display control circuit. The display control circuit stops the outputs of the plurality of light-emission control clock signals (ECK1 to ECK4) throughout a current measurement period in which a current corresponding to the characteristic of the drive transistor is measured.

20 Claims, 27 Drawing Sheets

(58) Field of Classification Search
CPC ......... G09G 2320/045; G09G 2370/08; G09G 3/3266; G11C 19/28
See application file for complete search history.

(56) References Cited

U.S. PATENT DOCUMENTS

2018/0144674 A1    5/2018  Gupta et al.
2019/0012948 A1*   1/2019  Ohara ................. G09G 3/3258

* cited by examiner

Fig.17

| PATTERN A | 1 → 6 → 3 → 5 → 2 → 4 |
|---|---|
| PATTERN B | 3 → 1 → 4 → 6 → 5 → 2 |
| PATTERN C | 6 → 2 → 5 → 3 → 4 → 1 |
| PATTERN D | 4 → 3 → 6 → 1 → 5 → 2 |

Fig.18

| X1 | C A D B |
|---|---|
| X2 | B D A C |
| X3 | A C B D |
| X4 | D B C A |

Fig.20

| Y 1 | X 1 X 2 X 3 X 4 |
|---|---|
| Y 2 | X 2 X 4 X 1 X 3 |
| Y 3 | X 3 X 1 X 4 X 2 |
| Y 4 | X 4 X 3 X 2 X 1 |

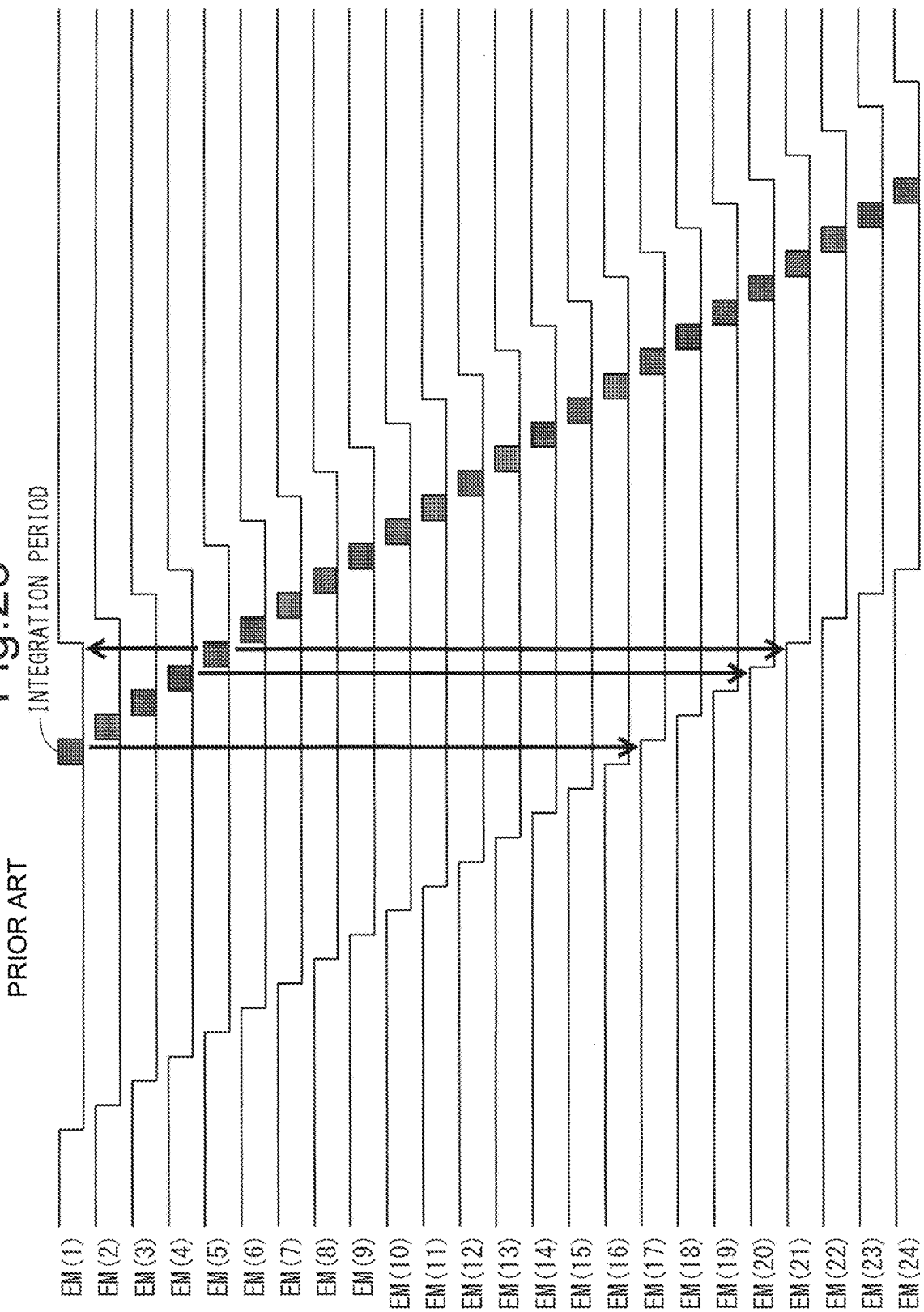

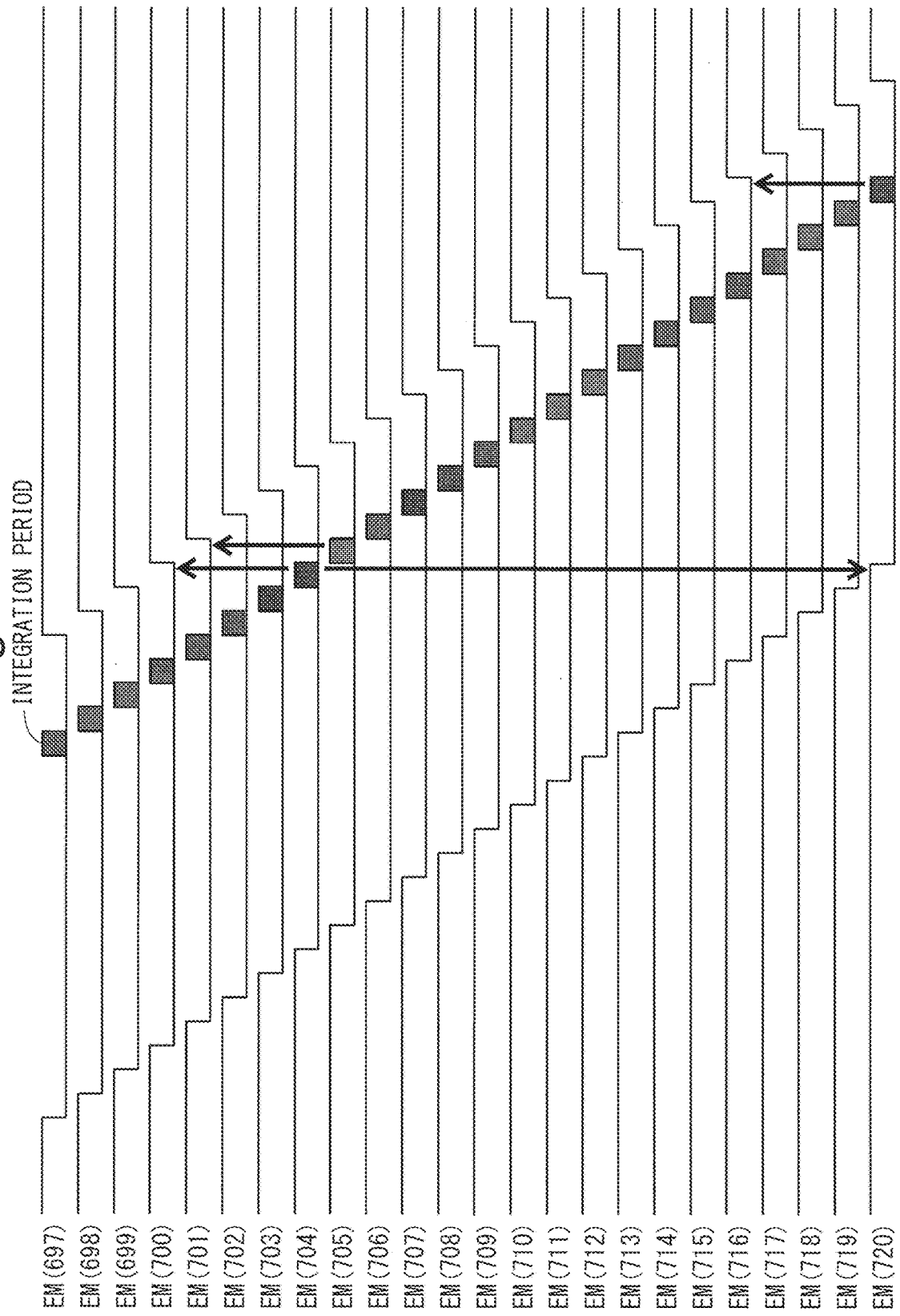

DISPLAY DEVICE AND METHOD FOR DRIVING SAME

TECHNICAL FIELD

The following disclosure relates to a display device and a method for driving the display device, and more particularly to a display device provided with a pixel circuit including a display element driven by a current, such as an organic electroluminescent (EL) element, and a method for driving the display device.

BACKGROUND ART

In recent years, an organic EL display device provided with a pixel circuit including an organic EL element has been put into practical use. The organic EL element is also called an organic light-emitting diode (OLED) and is a self-luminous display element that emits light with luminance corresponding to a current flowing therethrough. With the organic EL element being a self-luminous display element as described above, the organic EL display device can be easily reduced in thickness, power consumption and increased in luminance as compared to a liquid crystal display device that requires a backlight, a color filter, and the like.

In an active matrix-type organic EL display device, a plurality of pixel circuits are formed in a matrix form. Each pixel circuit includes a drive transistor that controls the supply of a current to the organic EL element. A thin-film transistor (TFT) is typically adopted as the drive transistor. However, regarding the thin-film transistor, the threshold voltage changes due to its degradation. Many drive transistors are provided in the display unit of the organic EL display device, and the degree of degradation varies for each drive transistor, and hence the threshold voltage varies. As a result, variations in luminance occur, and display quality deteriorates. In addition, regarding the organic EL element, the current efficiency decreases with the lapse of time. That is, even when a constant current is supplied to the organic EL element, the luminance gradually decreases with the lapse of time. As a result, image burn-in occurs. For the above reasons, in an active matrix-type organic EL display device, processing has been performed for compensating for the degradation of a drive transistor and the degradation of an organic EL element.

An external compensation method is known as one of compensation processing methods. According to the external compensation method, a current flowing through the drive transistor or the organic EL element is measured by a circuit provided outside the pixel circuit under a predetermined condition. Then, an input image signal is corrected on the basis of the measurement result. This leads to compensation for the degradation of the drive transistor and the degradation of the organic EL element.

Hereinafter, a series of processes for measuring a current, which flows in a pixel circuit, outside the pixel circuit in order to compensate for the degradation of a drive transistor or an organic EL element (display element) is referred to as a "monitoring process", and a period in which the monitoring process is performed is referred to as a "monitoring period". A row that is a target of the monitoring process during a unit period such as one frame period is referred to as a "monitoring row", and rows except for the monitoring row are referred to as "non-monitoring rows". The characteristic of the drive transistor provided in the pixel circuit is referred to as a "TFT characteristic", and the characteristic of the organic EL element provided in the pixel circuit is referred to as an "OLED characteristic". Applying a desired potential (voltage) to a data signal line to charge a capacitor (holding capacitor) in the pixel circuit is referred to as "writing".

Here, a method (hereinafter referred to as "real-time monitoring") in which the monitoring process is performed during a normal display period will be described. In the real-time monitoring, typically, a monitoring process for at least one row is performed in each frame period. That is, when the real-time monitoring has been adopted, as illustrated in FIG. 24, each frame period includes the monitoring period. Regarding each frame period, a period except for the monitoring period is a scanning period. The scanning period is a period in which a scanning signal line is scanned for image display. In FIG. 24, an oblique thick line schematically indicates a state in which a scanning signal line GL(1) in a first row to a scanning signal line GL(n) in an nth row are sequentially scanned for writing for image display.

FIG. 25 is a diagram schematically illustrating a shift of a light-off range (a range in which light emission of an organic EL element in a pixel circuit is stopped) 90 during a frame period. As can be grasped from FIG. 25, the light-off range 90 shifts from the first row to the nth row. In the monitoring row, the light emission of the organic EL element in the pixel circuit is stopped throughout the monitoring period.

FIG. 5 is a circuit diagram illustrating a pixel circuit 110 and a part of a source driver in the organic EL display device adopting the external compensation method. Note that FIG. 5 illustrates the pixel circuit 110 in an ith row and a jth column and a portion of the source driver corresponding to a data signal line SL(j) in the jth column. The source driver includes a portion functioning as a data signal line drive unit 310 that drives the data signal line and a portion functioning as a current monitoring unit 320 that measures a current outputted from the pixel circuit 110 to the data signal line SL(j).

The pixel circuit 110 includes one organic EL element L1, four transistors T1 to T4 (a write control transistor T1 that controls writing to the capacitor C, a drive transistor T2 that controls the supply of a current to the organic EL element L1, a monitoring control transistor T3 that controls whether to detect a TFT characteristic or an OLED characteristic, and a light-emission control transistor T4 that controls whether to cause the organic EL element L1 to emit light), and one capacitor C as a holding capacitor. The current monitoring unit 320 includes an operational amplifier 301, a digital to analog (D/A) converter 306, a capacitor 322, a switch 323 the state of which is controlled by a control signal S2, a switch 324 the state of which is controlled by a control signal S1, and a switch 325 the state of which is controlled by a control signal S0. With reference to FIG. 5, a scanning signal line in the ith row is denoted by reference sign GL(i), a monitoring control line in the ith row is denoted by reference sign ML(i), a light-emission control line in the ith row is denoted by reference sign EM(i), and a data signal line in the jth column is denoted by reference sign SL(j). In the following description, the same reference sign is used for the scanning signal line and the scanning signal, the same reference sign is used for the monitoring control line and the monitoring control signal, the same reference sign is used for the light-emission control line and the light-emission control signal, and the same reference sign is used for the data signal line and the data signal.

In the configuration as described above, for example, the detection of the TFT characteristic for one row or the detection of the OLED characteristic for one row is performed in each frame period (each vertical scanning period). FIG. 26 is a signal waveform diagram for explaining the operation in the monitoring period in a case where the TFT characteristic is detected. Hereinafter, an operation in each period during the monitoring period will be described. It is assumed that the ith row is a monitoring row.

When period P11 is reached, a light-emission control signal EM(i) changes from a high level to a low level. Thereby, the light-emission control transistor T4 is turned off, and the supply of the current to the organic EL element L1 is stopped. In period P11, the control signals S2, S1 are at the high level, and the control signal S0 is at the low level. Therefore, the switches 323, 324 are in an on-state, and the switch 325 is in an off-state. At this time, the data signal line SL(j) and the internal data line Sin(j) are connected electrically. In period P11, the scanning signal GL(i) and the monitoring control signal ML(i) are maintained at the high level. Therefore, the write control transistor T1 and the monitoring control transistor T3 are maintained in the on-state. In the state as described above, an initialization potential Vpc is applied to the data signal line SL(j). As a result, the state of the capacitor C and the potential of a node 111 (a node connected to the anode terminal of the organic EL element L1 via the light-emission control transistor T4) are initialized.

When period P12 is reached, the monitoring control signal ML(i) changes from the high level to the low level. Thereby, the monitoring control transistor T3 is turned off. In this state, a characteristic detection potential Vr_TFT is applied to the data signal line SL(j). As a result, the drive transistor T2 is turned on.

When period P13 is reached, the scanning signal GL(i) changes from the high level to the low level, and the monitoring control signal ML(i) changes from the low level to the high level. Thus, the write control transistor T1 is turned off, and the monitoring control transistor T3 is turned on. In such a state, a current measurement potential Vm_TFT is applied to the data signal line SL(j). As a result, the current flowing through the drive transistor T2 flows to the current monitoring unit 320 via the monitoring control transistor T3 and the data signal line SL(j). At this time, with the control signal S2 being at the high level, the switch 323 is in the on-state, and no charge is accumulated in the capacitor 322.

When period P14 is reached, the control signal S2 changes from the high level to the low level. Thus, the switch 323 is turned off, and the operational amplifier 301 and the capacitor 322 function as the integration circuit. That is, the output voltage of the operational amplifier 301 is a voltage corresponding to the current flowing through the data signal line SL(j). Hereinafter, a period in which a voltage proportional to the integration of the current is obtained by the integration circuit 35 as in period P14 is referred to as an "integration period".

When period P15 is reached, the control signal S1 changes from the high level to the low level, and the control signal S0 changes from the low level to the high level. Thereby, the switch 324 is turned off, and the switch 325 is turned on. By the turn-off of the switch 324, the data signal line SL(j) and the internal data line Sin(j) are electrically disconnected from each other. In this state, the output voltage of the operational amplifier 301 (monitor data MOa) is converted into monitor data MOd, which is digital data, by the A/D converter 31. Thus, the detection of the TFT characteristic for the ith row is completed. Note that the monitor data MOd after the A/D conversion is used to correct a digital video signal.

Thereafter, when period P16 is reached, the light-emission control signal EM(i) changes from the low level to the high level. Thereby, the light-emission control transistor T4 is turned on. When period P16 is reached, the control signals S2, S1 change from the low level to the high level, and the control signal S0 changes from the high level to the low level. Thus, the switches 323, 324 are turned on, and the switch 325 is turned off. In period P16, the scanning signal GL(i) changes from the low level to the high level. Thereby, the write control transistor T1 is turned on. In the state as described above, the data potential Vd (i) for image display is applied to the data signal line SL(j), and writing based on the data potential Vd (i) is performed in the pixel circuit 110 in the ith row and the jth column. As a result, the organic EL element L1 emits light.

When period P17 is reached, the scanning signal GL(i) changes from the high level to the low level. Thus, the write control transistor T1 is turned off. Note that, in period P17, writing based on the data potential Vd (i+1) for image display is performed in an (i+1)th row.

In the known organic EL display device, the monitoring process is performed as described above, and the degradation of the drive transistor T2 is compensated for by correcting the digital video signal on the basis of the result of the monitoring process.

Note that the invention related to the organic EL display device adopting the external compensation method is disclosed in, for example, WO 2015/190407.

PRIOR ART DOCUMENT

Patent Document

[Patent Document 1] WO 2015/190407

SUMMARY

Problems to be Solved by the Invention

The timing at which the light-emission control signal EM changes from the high level to the low level and the timing at which the light-emission control signal EM changes from the low level to the high level are slightly shifted for each row as illustrated in FIG. 27. Thus, as illustrated in a portion denoted by reference numeral 91 in FIG. 26 and portions denoted by reference numerals 92 and 93 in FIG. 27, there exists a light-emission control signal EM the level of which changes during the integration period P14. Further, as illustrated in FIG. 5, the light-emission control line EM is disposed to cross the data signal line SL. Hence a parasitic capacitance as denoted by reference numeral 99 in FIG. 5 exists between the light-emission control line EM and the data signal line SL. From the above, during the integration period P14, coupling noise occurs in the data signal line SL due to a change in the level of the light-emission control signal EM in the non-monitoring row. This prevents accurate measurement of the current flowing through the data signal line SL.

FIGS. 28 and 29 are diagrams for explaining an influence of coupling noise for each row. Here, it is assumed that the L-width of the light-emission control signal EM (the length of the period in which the light-emission control signal EM is maintained at the low level) is 20 H (horizontal scanning period), and the 16th-H out of 20 H corresponds to the integration period. Further, it is assumed that the number of rows of the display unit (the number of pixel circuits in the direction in which the data signal line SL extends) is 720.

The current measurement result in the integration period for the first row is affected by the fall of the light-emission control signal EM(17). The current measurement result in the integration period for the fourth row is affected by the fall of the light-emission control signal EM(20). As above, the current measurement results in the integration periods for the first to fourth row are affected by only the fall of the light-emission control signals EM of other rows.

The current measurement result in the integration period for the fifth row is affected by the rise of the light-emission control signal EM(1) and the fall of the light-emission control signal EM(21). The current measurement result in the integration period for the 704th row is affected by the rise of the light-emission control signal EM(700) and the fall of the light-emission control signal EM(720). As above, the current measurement results in the integration periods for the fifth to 704th rows are affected by both the rise and fall of the light-emission control signals EM of other rows.

The current measurement result in the integration period for the 705th row is affected by the rise of the light-emission control signal EM(701). The current measurement result in the integration period for the 720th row is affected by the rise of the light-emission control signal EM(716). As above, the current measurement results in the integration periods for the 705th to 720th rows are affected by only the rise of the light-emission control signals EM of other rows.

As described above, the influence of the coupling noise on the current measurement result is not the same in all the rows. Thus, the correction of a digital video signal on the basis of the current measurement result does not sufficiently compensate for the degradation of the drive transistor.

Therefore, an object of the following disclosure is to prevent a decrease in compensation accuracy caused by coupling noise generated in a data signal line in a display device having an external compensation function.

Means for Solving the Problems

A display device according to some embodiments of the present disclosure is a display device including a pixel circuit including a display element that is driven by a current and a drive transistor that controls a drive current of the display element, the display device having a function to perform a monitoring process that is a series of processes to measure, outside the pixel circuit, a current corresponding to a characteristic of the drive transistor and flowing in the pixel circuit, the display device including:

a display unit including a plurality of data signal lines, a plurality of scanning signal lines, and a plurality of light-emission control lines, the plurality of light-emission control lines corresponding to the plurality of scanning signal lines on a one-to-one basis and being disposed to intersect with the plurality of data signal lines;

a data signal line drive circuit configured to apply a data signal to each of the plurality of data signal lines;

a scanning signal line drive circuit configured to apply a scanning signal to each of the plurality of scanning signal lines;

a light-emission control line drive circuit configured to apply a light-emission control signal to each of the plurality of light-emission control lines, the light-emission control line drive circuit including a shift register formed of a plurality of unit circuits corresponding to the plurality of light-emission control lines on a one-to-one basis; and a control circuit configured to control operations of the data signal line drive circuit, the scanning signal line drive circuit, and the light-emission control line drive circuit, wherein the pixel circuit is provided correspondingly to each of intersections of the plurality of data signal lines and the plurality of scanning signal lines, the data signal line drive circuit has a function to measure the current corresponding to the characteristic of the drive transistor, the shift register generates a light-emission control signal to be applied to each of the light-emission control lines while transferring a light-emission control start pulse signal outputted from the control circuit from a first-stage unit circuit to a last-stage unit circuit on a basis of a plurality of light-emission control clock signals outputted from the control circuit, a monitoring period in which the monitoring process is performed includes a measurement write period, in which a data signal for allowing the current corresponding to the characteristic of the drive transistor to flow is written to the pixel circuit, and a current measurement period, in which the current corresponding to the characteristic of the drive transistor is measured by the data signal line drive circuit, and the control circuit stops outputs of the plurality of light-emission control clock signals throughout the current measurement period.

A display device according to some other embodiments of the present disclosure is a display device including a pixel circuit including a display element that is driven by a current and a drive transistor that controls a drive current of the display element, the display device having a function to perform a monitoring process that is a series of processes to measure, outside the pixel circuit, a current corresponding to a characteristic of the drive transistor and flowing in the pixel circuit, the display device including:

a display unit including a plurality of data signal lines, a plurality of scanning signal lines, and a plurality of light-emission control lines, the plurality of light-emission control lines corresponding to the plurality of scanning signal lines on a one-to-one basis and being disposed to intersect with the plurality of data signal lines; and a data signal line drive circuit configured to apply a data signal to each of the plurality of data signal lines, wherein the pixel circuit is provided correspondingly to each of intersections of the plurality of data signal lines and the plurality of scanning signal lines, and the data signal line drive circuit has a function to measure the current corresponding to the characteristic of the drive transistor, a monitoring period in which the monitoring process is performed includes a measurement write period, in which a data signal for allowing the current corresponding to the characteristic of the drive transistor to flow is written to the pixel circuit, and a current measurement period, in which the current corresponding to the characteristic of the drive transistor is measured by the data signal line drive circuit, and each of light-emission control signals applied to the plurality of light-emission control lines is maintained at an on-level or an off-level throughout the current measurement period.

A drive method (for a display device) according to some embodiments of the present disclosure is a method for driving a display device provided with a pixel circuit including a display element that is driven by a current and a drive transistor that controls a drive current of the display element, the display device having a function to perform a monitoring process that is a series of processes to measure, outside the pixel circuit, a current corresponding to a characteristic of the drive transistor and flowing in the pixel circuit, wherein the display device includes a display unit including a plurality of data signal lines, a plurality of scanning signal lines, and a plurality of light-emission control lines, the plurality of light-emission control lines corresponding to the plurality of scanning signal lines on a one-to-one basis and being disposed to intersect with the plurality of data signal lines, a data signal line drive circuit configured to apply a data signal to each of the plurality of data signal lines, a scanning signal line drive circuit configured to apply a scanning signal to each of the plurality of scanning signal lines, a light-emission control line drive circuit configured to apply a light-emission control signal to each of the plurality of light-emission control lines, the light-emission control line drive circuit including a shift register formed of a plurality of unit circuits corresponding to the plurality of light-emission control lines on a one-to-one basis, and a control circuit configured to control operations of the data signal line drive circuit, the scanning signal line drive circuit, and the light-emission control line drive circuit, the pixel circuit is provided correspondingly to each of intersections of the plurality of data signal lines and the plurality of scanning signal lines, the data signal line drive circuit has a function to measure the current corresponding to the characteristic of the drive transistor, the shift register generates a light-emission control signal to be applied to each of the light-emission control lines while transferring a light-emission control start pulse signal outputted from the control circuit from a first-stage unit circuit to a last-stage unit circuit on a basis of a plurality of light-emission control clock signals outputted from the control circuit, and the driving method includes:

a measurement writing step of writing, to the pixel circuit, a data signal for causing the current corresponding to the characteristic of the drive transistor to flow;

a light-emission control clock signal output stopping step of stopping outputs of the plurality of light-emission control clock signals from the control circuit;

a current measurement step of measuring the current corresponding to the characteristic of the drive transistor by the data signal line drive circuit; and a light-emission control clock signal output restarting step of restarting the outputs of the plurality of light-emission control clock signals from the control circuit.

A drive method (for a display device) according to some other embodiments of the present disclosure is a method for driving a display device provided with a pixel circuit including a display element that is driven by a current and a drive transistor that controls a drive current of the display element, the display device having a function to perform a monitoring process that is a series of processes to measure, outside the pixel circuit, a current corresponding to a characteristic of the drive transistor and flowing in the pixel circuit, wherein the display device includes a display unit including a plurality of data signal lines, a plurality of scanning signal lines, and a plurality of light-emission control lines, the plurality of light-emission control lines corresponding to the plurality of scanning signal lines on a one-to-one basis and being disposed to intersect with the plurality of data signal lines, and a data signal line drive circuit configured to apply a data signal to each of the plurality of data signal lines, the pixel circuit is provided correspondingly to each of intersections of the plurality of data signal lines and the plurality of scanning signal lines, and the data signal line drive circuit has a function to measure the current corresponding to the characteristic of the drive transistor, and the driving method includes:

a measurement writing step of writing, to the pixel circuit, a data signal for causing the current corresponding to the characteristic of the drive transistor to flow; and a current measurement step of measuring, by the data signal line drive circuit, the current corresponding to the characteristic of the drive transistor in a state where each of light-emission control signals applied to the plurality of light-emission control lines is maintained at an on-level or an off-level.

Effects of the Invention

According to some embodiments of the present disclosure, the control circuit stops the outputs of the light-emission control clock signal throughout the current measurement period for measuring the current corresponding to the characteristic of the drive transistor. Therefore, each of the light-emission control signals applied to the plurality of light-emission control lines disposed in the display unit is maintained at a constant level throughout the current measurement period. Thus, during the current measurement period, coupling noise due to the presence of a parasitic capacitance between the light-emission control line and the data signal line does not occur. Therefore, the current corresponding to the characteristic of the drive transistor is accurately detected at the time of the monitoring process. From the above, in the display device having the external compensation function, the degradation of the compensation accuracy caused by the coupling noise generated in the data signal line is prevented.

BRIEF DESCRIPTION OF THE DRAWINGS

FIG. 17 is a diagram illustrating an example of a plurality of patterns each defining an order of a monitoring process in the second embodiment.

FIG. 18 is a diagram for explaining a method for making the shift of the monitoring row irregular in the second embodiment.

FIG. 20 is a diagram for explaining a method for making the shift of the monitoring row irregular in the second embodiment.

FIG. 28 is a diagram for explaining an influence of coupling noise for each row regarding the related art.

FIG. 29 is a diagram for explaining an influence of coupling noise for each row regarding the related art.

MODES FOR CARRYING OUT THE INVENTION

Embodiments will be described below with reference to the accompanying drawings. In the following description, it is assumed that m and n are integers of 2 or more, i is an integer of 3 or more and (n−2) or less, and j is an integer of 1 or more and m or less.

1. First Embodiment

1.1 Overall Configuration

Figure 2:
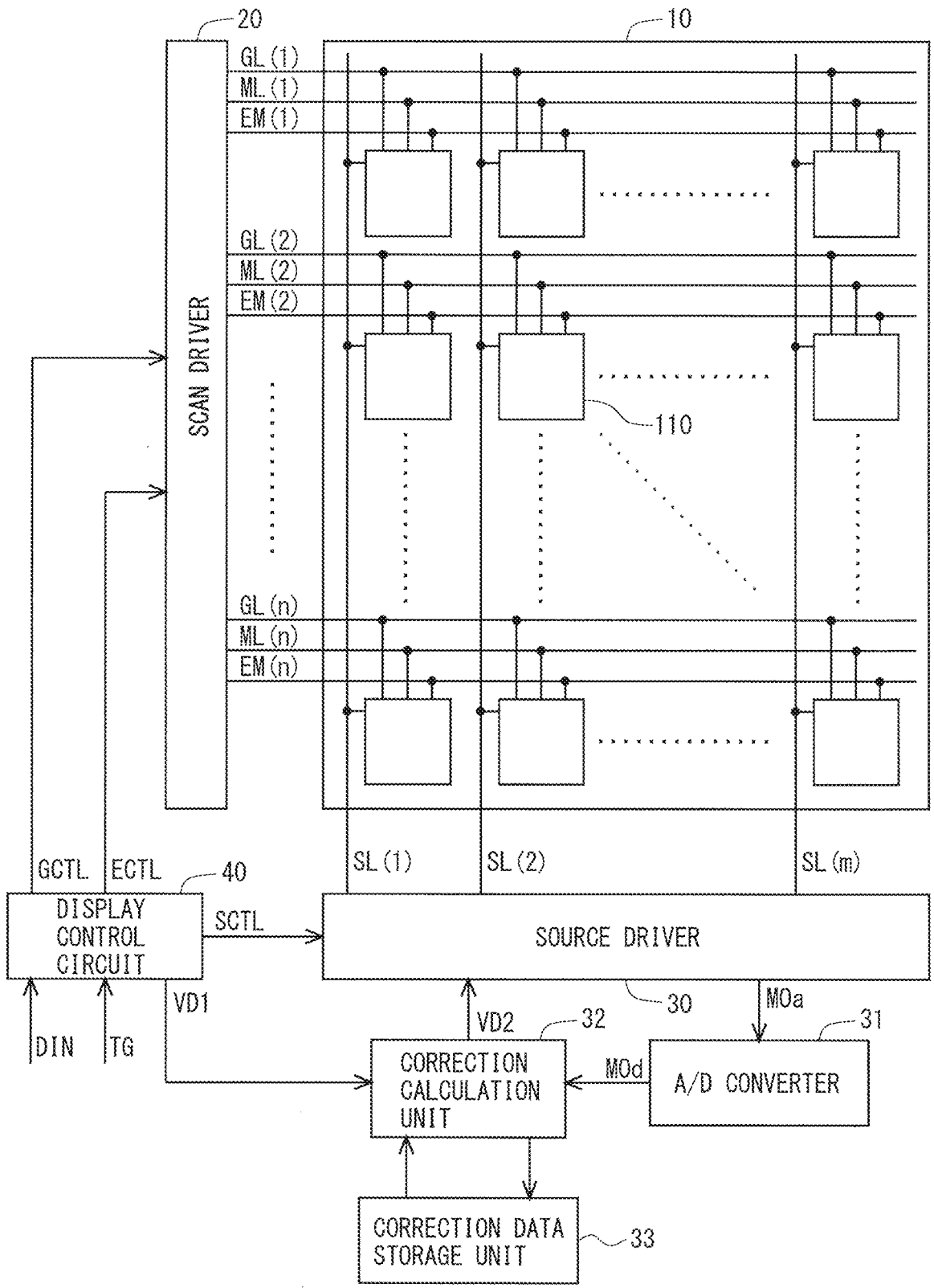
FIG. 2 is a block diagram illustrating an overall configuration of an organic EL display device in the first embodiment.

FIG. 2 is a block diagram illustrating an overall configuration of an active matrix-type organic EL display device according to the first embodiment. The organic EL display device includes a display unit 10, a scan driver 20, a source driver (data signal line drive circuit) 30, an A/D converter 31, a correction calculation unit 32, a correction data storage unit 33, and a display control circuit 40. The A/D converter 31, the correction calculation unit 32, and the correction data storage unit 33 are components for compensating for the degradation of a drive transistor and an organic EL element. That is, the organic EL display device has an external compensation function. Note that the real-time monitoring described above is performed in this organic EL display device in order to perform the compensation processing by the external compensation method. The display unit 10 and the scan driver 20 are integrally formed on a substrate constituting the display unit 10. That is, the scan driver 20 is monolithically integrated.

In the display unit 10, m data signal lines SL(1) to SL(m) and n scanning signal lines GL(1) to GL(n) orthogonal thereto are disposed. In addition, the display unit 10 is provided with n monitoring control lines ML(1) to ML(n) so as to correspond to the n scanning signal lines GL(1) to GL(n) on a one-to-one basis. Furthermore, the display unit 10 is provided with n light-emission control lines EM(1) to EM(n) so as to correspond to the n scanning signal lines GL(1) to GL(n) on a one-to-one basis. The scanning signal lines GL(1) to GL(n), the monitoring control lines ML(1) to ML(n), and the light-emission control lines EM(1) to EM(n) are parallel to each other. Furthermore, in the display unit 10, (n×m) pixel circuits 110 are provided corresponding to the intersections of the data signal lines SL(1) to SL(m) and the scanning signal lines GL(1) to GL(n). Thus, a pixel matrix of n rows x m columns is formed in the display unit 10. Further, in the display unit 10, power lines (not illustrated) common to the pixel circuits 110 are also disposed. More specifically, a power line that supplies a high-level power supply voltage ELVDD for driving the organic EL element (hereinafter referred to as a "high-level power line") and a power line that supplies a low-level power supply voltage ELVSS for driving the organic EL element (hereinafter referred to as a "low-level power line") are disposed. The high-level power supply voltage ELVDD and the low-level power supply voltage ELVSS are supplied from a power supply circuit that is not illustrated.

The display control circuit 40 receives an input image signal DIN and a timing signal group (a horizontal synchronization signal, a vertical synchronization signal, etc.) TG which are transmitted from the outside, and outputs a digital video signal VD1, a control signal SCTL for controlling the operation of the source driver 30, a control signal GCTL for controlling the operation of a gate driver described later in the scan driver 20, and a control signal ECTL for controlling the operation of an emission driver described later in the scan driver 20. The control signal SCTL includes a source start pulse signal, a source clock signal, a latch strobe signal, and the like. The control signal GCTL includes a gate start pulse signal, a gate clock signal, an enable signal, and the like. The control signal ECTL includes a light-emission control start pulse signal and a light-emission control clock signal.

The A/D converter 31 converts monitor data (data measured to obtain the TFT characteristic or OLED characteristic) MOa, which is analog data outputted from the source driver 30, into monitor data MOd, which is digital data. The correction data storage unit 33 stores correction data necessary for the correction calculation by the correction calculation unit 32. The correction calculation unit 32 updates the correction data stored in the correction data storage unit 33 on the basis of the monitor data MOd outputted from the A/D converter 31. Further, the correction calculation unit 32 corrects the digital video signal VD1 outputted from the display control circuit 40 with reference to the correction data stored in the correction data storage unit 33, and outputs a corrected digital video signal VD2.

Figure 3:
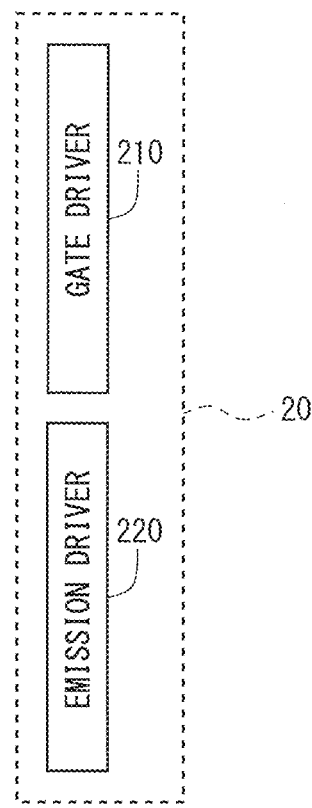
FIG. 3 is a diagram for explaining a function of a scan driver in the first embodiment.

As illustrated in FIG. 3, the scan driver 20 functionally includes a portion functioning as a gate driver (scanning signal line drive circuit) 210 that drives the scanning signal lines GL(1) to GL(n) and the monitoring control lines ML(1) to ML(n), and a portion functioning as an emission driver (light-emission control line drive circuit) 220 that drives the light-emission control lines EM(1) to EM(n). The gate driver 210 is connected to the scanning signal lines GL(1) to GL(n) and the monitoring control lines ML(1) to ML(n). As described later, the gate driver 210 includes a shift register formed of a plurality of unit circuits. The gate driver 210 applies a scanning signal to each of the scanning signal lines GL(1) to GL(n) and applies a monitoring control signal to each of the monitoring control lines ML(1) to ML(n) on the basis of the control signal GCTL outputted from the display control circuit 40. The emission driver 220 is connected to the light-emission control lines EM(1) to EM(n). Similarly to the gate driver 210, the emission driver 220 includes a shift register formed of a plurality of unit circuits. The emission driver 220 applies a light-emission control signal to each of the light-emission control lines EM(1) to EM(n) on the basis of the control signal ECTL outputted from the display control circuit 40.

Figure 4:
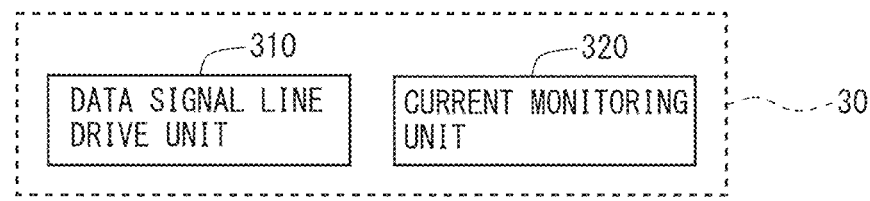
FIG. 4 is a diagram for explaining a function of a source driver in the first embodiment.

The source driver 30 is connected to the data signal lines SL(1) to SL(m). The source driver 30 selectively performs an operation of driving the data signal lines SL(1) to SL(m) and an operation of measuring currents flowing through the data signal lines SL(1) to SL(m). That is, as illustrated in FIG. 4, the source driver 30 functionally includes a portion functioning as a data signal line drive unit 310 that drives the data signal lines SL(1) to SL(m) and a portion functioning as a current monitoring unit 320 that measures currents outputted to the data signal lines SL(1) to SL(m) from the pixel circuits 110. The current monitoring unit 320 measures currents flowing through the data signal lines SL(1) to SL(m) and outputs monitor data MOa based on the measured values. As described above, in the present embodiment, the data signal lines SL(1) to SL(m) are used not only for transmitting data signals for image display but are also used as signal lines for allowing a current corresponding to the characteristic of a drive transistor or an organic EL element to flow at the time of the monitoring process.

As described above, the scanning signal is applied to each of the scanning signal lines GL(1) to GL(n), the monitoring control signal is applied to each of the monitoring control lines ML(1) to ML(n), the light-emission control signal is applied to each of the light-emission control lines EM(1) to EM(n), and the data signal as a luminance signal is applied to each of the data signal lines SL(1) to SL(m), whereby an image based on the input image signal DIN is displayed on the display unit 10. In addition, the degradations of the drive transistors or the organic EL elements are compensated for because the monitoring process is performed and the compensation calculation processing is performed in accordance with the result of the monitoring process.

1.2 Pixel Circuit and Source Driver

Next, the pixel circuit 110 and the source driver 30 will be described in detail. When functioning as the data signal line drive unit 310, the source driver 30 performs the following operation. The source driver 30 receives the control signal SCTL outputted from the display control circuit 40 and applies a voltage corresponding to the target luminance, as a data signal, to each of the m data signal lines SL(1) to SL(m). At this time, in the source driver 30, the digital video signal VD2 indicating the voltage to be applied to each data signal line SL is sequentially held at a timing when the pulse of the source clock signal is generated using the pulse of the source start pulse signal as a trigger. Then, the held digital video signals VD2 are converted into analog voltages at a timing when the pulse of the latch strobe signal is generated. The converted analog voltages are simultaneously applied to all the data signal lines SL(1) to SL(m) as data signals. When functioning as the current monitoring unit 320, the source driver 30 applies an appropriate voltage for the monitoring process as data signals to the data signal lines SL(1) to SL(m), thereby converting currents flowing through the data signal lines SL(1) to SL(m) into voltages. The converted voltages are outputted from the source driver 30 as the monitor data MOa.

Figure 5:
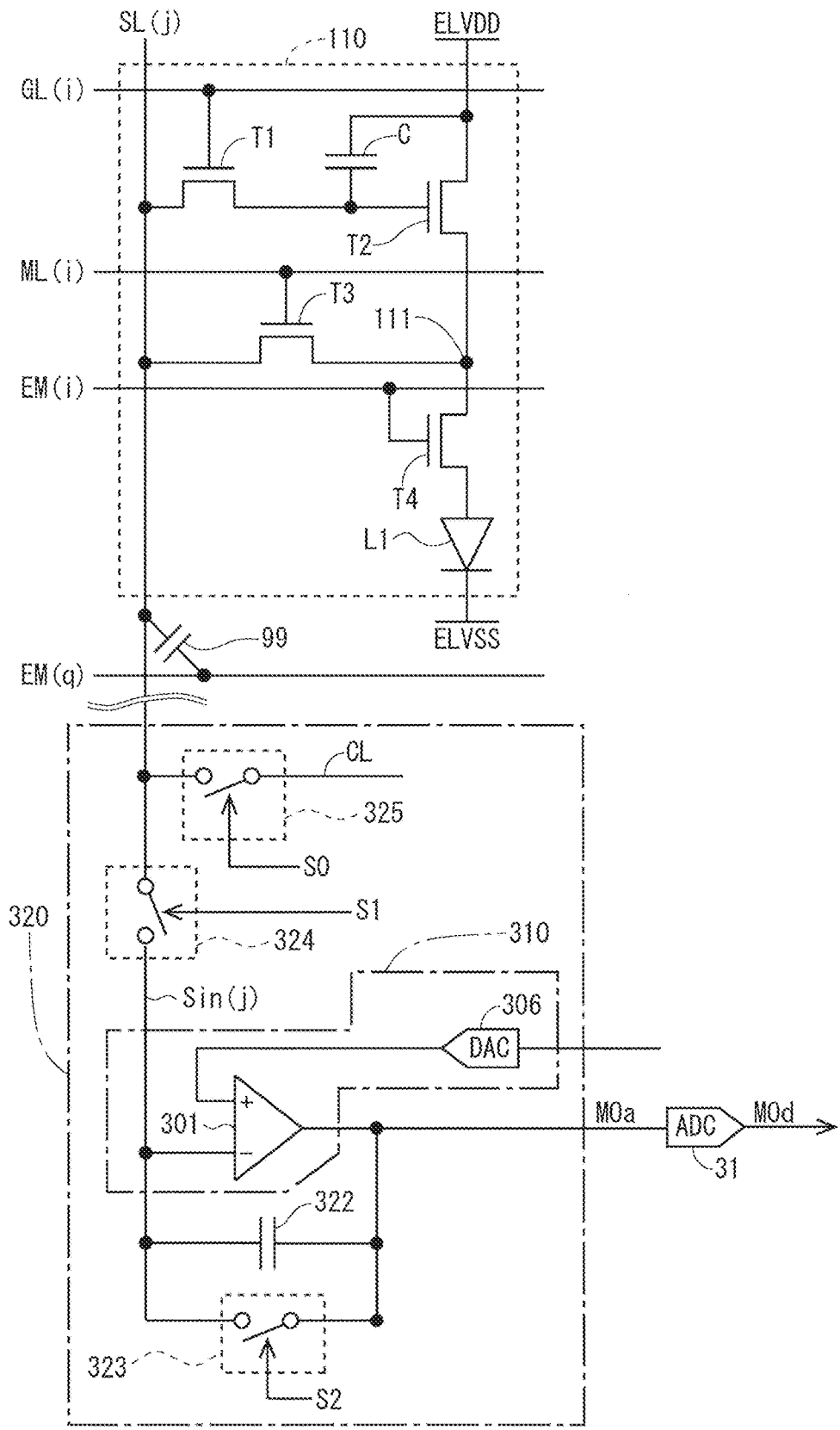
FIG. 5 is a circuit diagram illustrating a pixel circuit and a part of a source driver in the first embodiment.

FIG. 5 is a circuit diagram illustrating the pixel circuit 110 and a part of the source driver 30. Note that FIG. 5 illustrates the pixel circuit 110 in the ith row and the jth column and a portion of the source driver 30 corresponding to the jth data signal line SL(j). The pixel circuit 110 includes one organic EL element L1 as a display element, four transistors T1 to 14 (a write control transistor T1 that controls writing to the capacitor C, a drive transistor T2 that controls the supply of a current to the organic EL element L1, a monitoring control transistor T3 that controls whether to detect a TFT characteristic or an OLED characteristic, and a light-emission control transistor T4 that controls whether to cause the organic EL element L1 to emit light), and one capacitor (capacitive element) C as a holding capacitor. In the present embodiment, the transistors T1 to T4 are n-channel thin-film transistors. As each of the transistors T1 to T4, an oxide TFT (a thin-film transistor using an oxide semiconductor for a channel layer), an amorphous silicon TFT, or the like can be adopted. Examples of the oxide TFT include a TFT containing indium gallium zinc oxide (InGaZnO). Adopting the oxide TFT enables, for example, high definition and low power consumption.

The write control transistor T1 has a control terminal connected to the scanning signal line GL(i), a first conduction terminal connected to the data signal line SL(j), and a second conduction terminal connected to the control terminal of the drive transistor T2 and one end of the capacitor C. The drive transistor T2 has the control terminal connected to the second conduction terminal of the write control transistor T1 and one end of the capacitor C, a first conduction terminal connected to the other end of the capacitor C and the high-level power line, and a second conduction terminal connected to the first conduction terminal of the monitoring control transistor T3 and the first conduction terminal of the light-emission control transistor 14. The monitoring control transistor T3 has a control terminal connected to the monitoring control line ML(i), the first conduction terminal connected to the second conduction terminal of the drive transistor T2 and the first conduction terminal of the light-emission control transistor T4, and a second conduction terminal connected to the data signal line SL(j). The light-emission control transistor T4 has a control terminal connected to the light-emission control line EM(i), the first conduction terminal connected to the second conduction terminal of the drive transistor T2 and the first conduction terminal of the monitoring control transistor T3, and a second conduction terminal connected to the anode terminal (first terminal) of the organic EL element L1. The capacitor C has one end connected to the second conduction terminal of the write control transistor T1 and the control terminal of the drive transistor T2, and the other end connected to the first conduction terminal of the drive transistor T2 and the high-level power line. The organic EL element L1 has an anode terminal connected to the second conduction terminal of the light-emission control transistor T4, and a cathode terminal (second terminal) connected to the low-level power line.

Next, a portion functioning as the current monitoring unit 320 out of the source driver 30 will be described. As illustrated in FIG. 5, the current monitoring unit 320 includes the D/A converter 306, the operational amplifier 301, the capacitor 322, and three switches (switches 323, 324, and 325). Note that the operational amplifier 301 and the D/A converter 306 also function as components of the data signal line drive unit 310. The current monitoring unit 320 is provided with control signals S0, S1, and S2 for controlling the states of the three switches as the control signal SCTL. The internal data line Sin(j) of the current monitoring unit 320 is connected to the data signal line SL(j) via the switch 324. The operational amplifier 301 has an inverting input terminal connected to the internal data line Sin(j), and a non-inverting input terminal provided with an output from the D/A converter 306. The capacitor 322 and the switch 323 are provided between the output terminal of the operational amplifier 301 and the internal data line Sin(j). A control signal S2 is provided to the switch 323. The operational amplifier 301, the capacitor 322, and the switch 323 constitute the integration circuit. Here, the operation of the integration circuit will be described. When the switch 323 is in the on-state, a short circuit has occurred between the output terminal and the inverting input terminal of the operational amplifier 301 (i.e., between two electrodes of the capacitor 322). At this time, no charge is accumulated in the capacitor 322, and the potentials of the output terminal of the operational amplifier 301 and the internal data line Sin(j) are equal to the output potential from the D/A converter 306. When the switch 323 is switched from the on-state to the off-state, the capacitor 322 is charged on the basis of the current flowing through the internal data line Sin(j). That is, the time integration value of the current flowing through the internal data line Sin(j) is accumulated in the capacitor 322. As a result, the potential of the output terminal of the operational amplifier 301 changes in accordance with the magnitude of the current flowing through the internal data line Sin(j). The output from the operational amplifier 301 is outputted from the source driver 30 as the monitor data MOa. As described above, the monitor data MOa is converted into the monitor data MOd, which is digital data, by the A/D converter 31.

The switch 324 is provided between the data signal line SL(j) and the internal data line Sin(j). A control signal S1 is provided to the switch 324. By switching the state of the switch 324 on the basis of the control signal S1, the state of the electrical connection between the data signal line SL(j) and the internal data line Sin(j) is controlled. In the present embodiment, when the control signal S1 is at the high level, the data signal line SL(j) and the internal data line Sin(j) are in an electrically connected state, and when the control signal S1 is at the low level, the data signal line SL(j) and the internal data line Sin(j) are in an electrically disconnected state.

The switch 325 is provided between the data signal line SL(j) and the control line CL. The control signal S0 is provided to the switch 325. By switching the state of the switch 325 on the basis of the control signal S0, the state of the electrical connection between the data signal line SL(j) and the control line CL is controlled. In the present embodiment, when the control signal S0 is at the high level, the data signal line SL(j) and the control line CL are in the electrically connected state, and when the control signal S0 is at the low level, the data signal line SL(j) and the control line CL are in an electrically disconnected state. When the data signal line SL(j) and the control line CL are electrically connected, the state of the data signal line SL(j) becomes high impedance.

As described above, when the switch 324 is turned off, the data signal line SL(j) and the internal data line Sin(j) are electrically disconnected from each other. At this time, when the switch 323 is in the off-state, the potential of the internal data line Sin(j) is maintained. In the present embodiment, A/D conversion in the A/D converter 31 is performed in a state where the potential of the internal data line Sin(j) is maintained in the above manner.

1.3 Gate Driver

<1.3.1 Configuration of Shift Register>

A detailed configuration of the gate driver 210 in the present embodiment will be described. Note that the configuration described here is an example, and it is not limited to this. The gate driver 210 includes a shift register formed of a plurality of stages (at least n unit circuits). A pixel matrix of n rows x m columns is formed in the display unit 10, and each stage (each unit circuit) of the shift register is provided so as to correspond to each row of the pixel matrix on a one-to-one basis.

Figure 6:
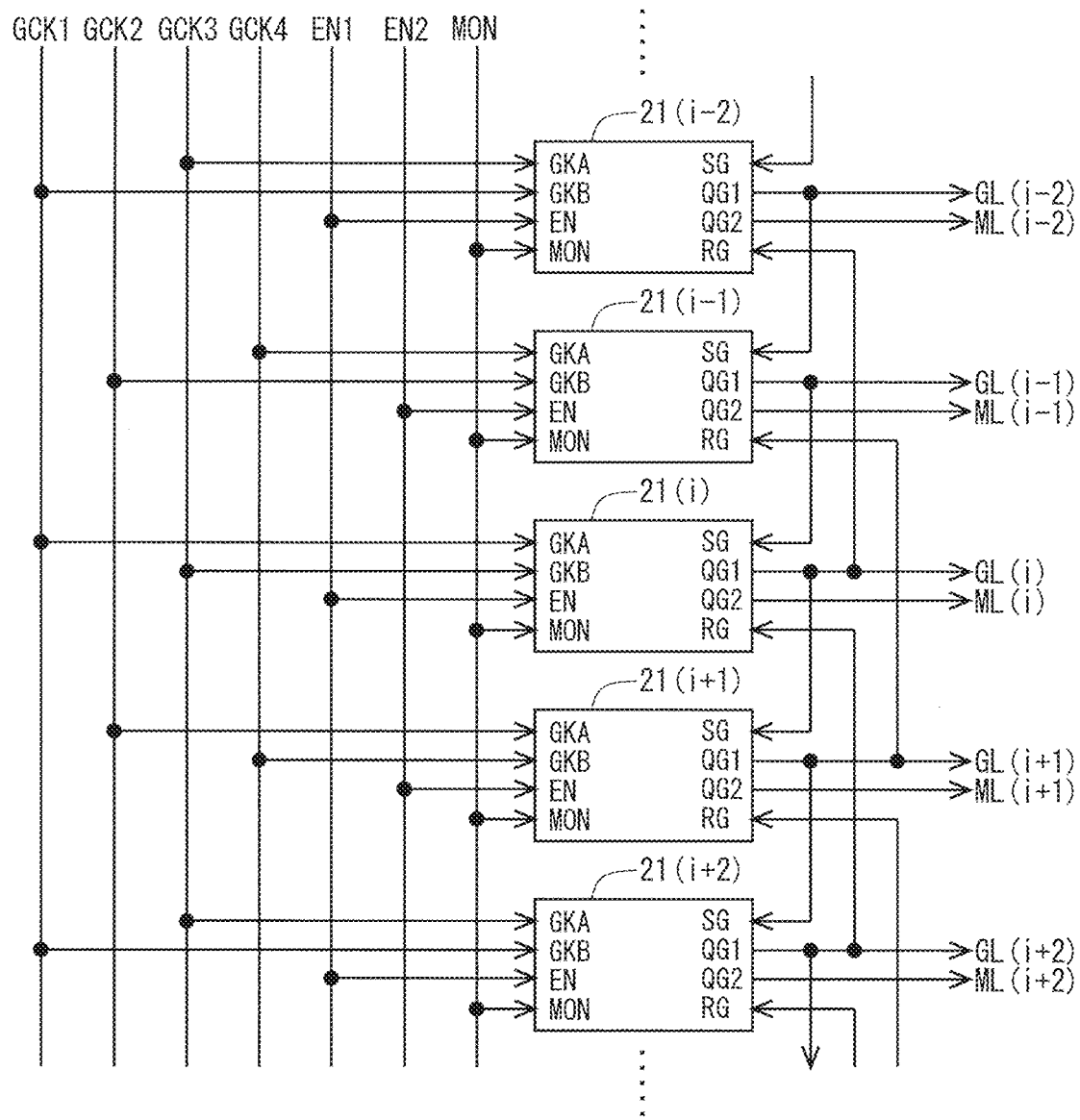
FIG. 6 is a block diagram illustrating a configuration of five stages of a shift register constituting a gate driver in the first embodiment.

FIG. 6 is a block diagram illustrating a configuration of five stages of the shift register. Here, it is assumed that i is an integer of 3 or more and (n−2) or less, and attention is focused on unit circuits 21(i−2), 21(i−1), 21(i), 21(i+1), and 21(i+2) in an (i−2)th stage, an (i−1)th stage, an ith stage, an (i+1)th stage, and an (i+2)th stage. The shift register is provided with a gate start pulse signal, a gate clock signal GCK1, a gate clock signal GCK2, a gate clock signal GCK3, a gate clock signal GCK4, an enable signal EN1, an enable signal EN2, and a control signal MON as the control signal GCTL. Note that the gate start pulse signal is a signal provided to the unit circuit 21(1) in the first stage as a set signal SG and is omitted in FIG. 6.

Each unit circuit 21 includes input terminals for receiving a clock signal GKA, a clock signal GKB, an enable signal EN, the control signal MON, the set signal SG, and a reset signal RG, and output terminals for outputting the output signal QG1 and the output signal QG2.

For the unit circuit 21(*i*–2), the gate clock signal GCK3 is provided as the clock signal GKA, the gate clock signal GCK1 is provided as the clock signal GKB, and the enable signal EN1 is provided as the enable signal EN. For the unit circuit 21(*i*–1), the gate clock signal GCK4 is provided as the clock signal GKA, the gate clock signal GCK2 is provided as the clock signal GKB, and the enable signal EN2 is provided as the enable signal EN. For the unit circuit 21(*i*), the gate clock signal GCK1 is provided as the clock signal GKA, the gate clock signal GCK3 is provided as the clock signal GKB, and the enable signal EN1 is provided as the enable signal EN. For the unit circuit 21(*i*+1), the gate clock signal GCK2 is provided as the clock signal GKA, the gate clock signal GCK4 is provided as the clock signal GKB, and the enable signal EN2 is provided as the enable signal EN. The configuration as described above is repeated in four stages. The control signal MON is commonly provided to all the unit circuits 21. To the unit circuit 21 in each stage, the output signal QG1 from the unit circuit 21 in the previous stage is provided as the set signal SG, and the output signal QG1 from the unit circuit 21 two stages after is provided as the reset signal RG. The output signal QG1 from the unit circuit 21 in each stage is provided as a reset signal RG to the unit circuit 21 two stages before, is provided as a set signal SG to the unit circuit 21 in the subsequent stage, and is provided as a scanning signal to the corresponding scanning signal line GL. The output signal QG2 from the unit circuit 21 in each stage is provided to a corresponding monitoring control line ML as a monitoring control signal. Note that, as illustrated in FIG. 5, the scanning signal line GL is connected to the control terminal of the write control transistor T1 in the pixel circuit 110, and the monitoring control line ML is connected to the control terminal of the monitoring control transistor T3 in the pixel circuit 110.

<1.3.2 Configuration of Unit Circuit>

Figure 7:
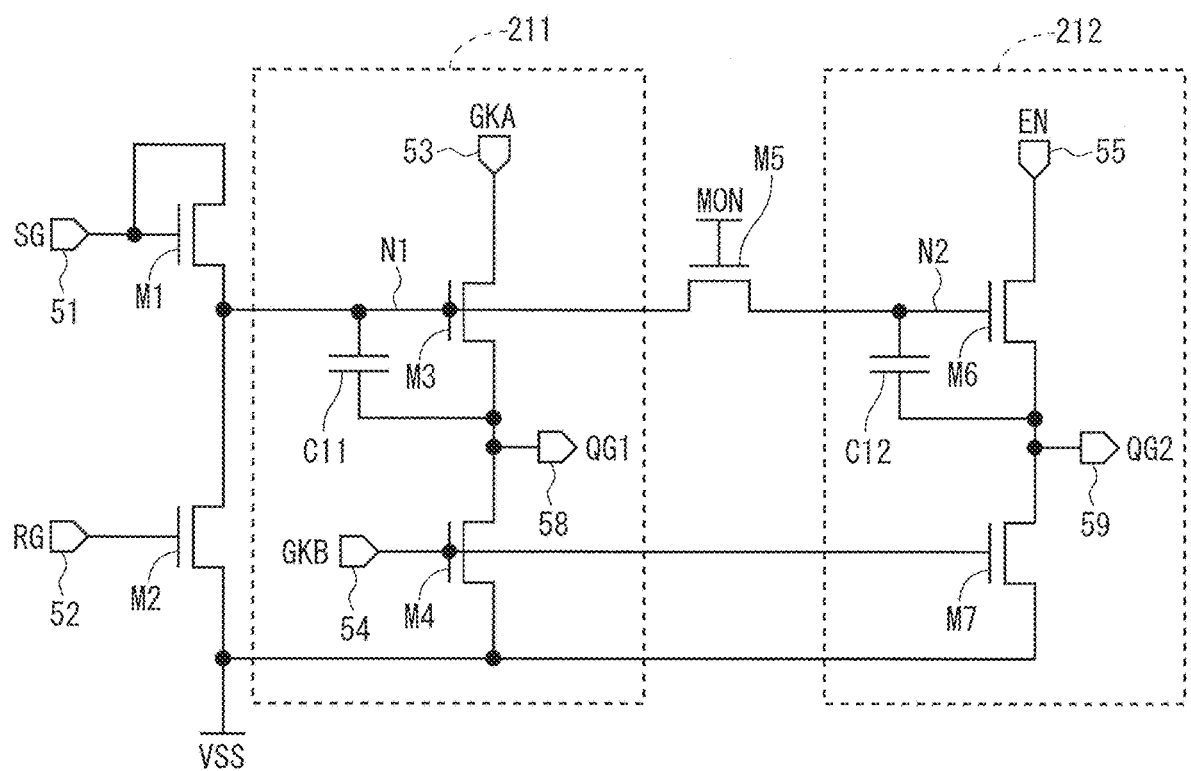
FIG. 7 is a circuit diagram illustrating a configuration of a unit circuit in the gate driver in the first embodiment.

FIG. 7 is a circuit diagram illustrating the configuration of the unit circuit 21. As illustrated in FIG. 7, the unit circuit 21 includes seven transistors M1 to M7 and two capacitors C11, C12. Further, the unit circuit 21 includes five input terminals 51 to 55 and two output terminals 58, 59 in addition to an input terminal connected to a control signal line that transmits the control signal MON and an input terminal connected to a power line (hereinafter referred to as a "first reference potential line") to which a low-level potential VSS is applied. In FIG. 7, an input terminal for receiving the set signal SG is denoted by reference numeral 51, an input terminal for receiving the reset signal RG is denoted by reference numeral 52, an input terminal for receiving the clock signal GKA is denoted by reference numeral 53, an input terminal for receiving the clock signal GKB is denoted by reference numeral 54, an input terminal for receiving the enable signal EN is denoted by reference numeral 55, an output terminal for outputting the output signal QG1 is denoted by reference numeral 58, and an output terminal for outputting the output signal QG2 is denoted by reference numeral 59.

The second conduction terminal of the transistor M1, the first conduction terminal of the transistor M2, the control terminal of the transistor M3, the first conduction terminal of the transistor M5, and one end of the capacitor C11 are connected to each other. Note that an area (wiring) where these are connected to each other is referred to as a "first internal node". The first internal node is denoted by reference sign N1. The second conduction terminal of the transistor M5, the control terminal of the transistor M6, and one end of the capacitor C12 are connected to each other. Note that an area (wiring) where these are connected to each other is referred to as a "second internal node". The second internal node is denoted by reference sign N2.

Meanwhile, the unit circuit 21 includes a first output control circuit 211 that controls the output of the output signal QG1 and a second output control circuit 212 that controls the output of the output signal QG2. The first output control circuit 211 includes the transistor M3 and the transistor M4. The second output control circuit 212 includes the transistor M6 and the transistor M7.

The transistor M1 has a control terminal and a first conduction terminal connected to the input terminal 51 (i.e., diode-connected.), and a second conduction terminal connected to the first internal node N1. The transistor M2 has a control terminal connected to the input terminal 52, a first conduction terminal connected to the first internal node N1, and a second conduction terminal connected to the first reference potential line. The transistor M3 has a control terminal connected to the first internal node N1, a first conduction terminal connected to the input terminal 53, and a second conduction terminal connected to the output terminal 58. The transistor M4 has a control terminal connected to the input terminal 54, a first conduction terminal connected to the output terminal 58, and a second conduction terminal connected to the first reference potential line. The transistor M5 has a control terminal connected to the control signal line, a first conduction terminal connected to the first internal node N1, and a second conduction terminal connected to the second internal node N2. The transistor M6 has a control terminal connected to the second internal node N2, a first conduction terminal connected to the input terminal 55, and a second conduction terminal connected to the output terminal 59. The transistor M7 has a control terminal connected to the input terminal 54, a first conduction terminal connected to the output terminal 59, and a second conduction terminal connected to the first reference potential line. The capacitor C11 has one end connected to the first internal node N1 and the other end connected to the output terminal 58. The capacitor C12 has one end connected to the second internal node N2 and the other end connected to the output terminal 59.

Here, attention is focused on the transistor M5. In a period in which the control signal MON provided to the control signal line is at the high level, the transistor M5 is maintained in the on-state except when the potential of the second internal node N2 is higher than a normal high level. The transistor M5 is turned off when the potential of the second internal node N2 becomes equal to or higher than a predetermined value, and electrically disconnects the first internal node N1 and the second internal node N2.

Thereby, the transistor M5 assists an increase in the potential of the second internal node N2 when the second internal node N2 is in a boost state.

<1.3.3 Operation of Unit Circuit>

Figure 8:
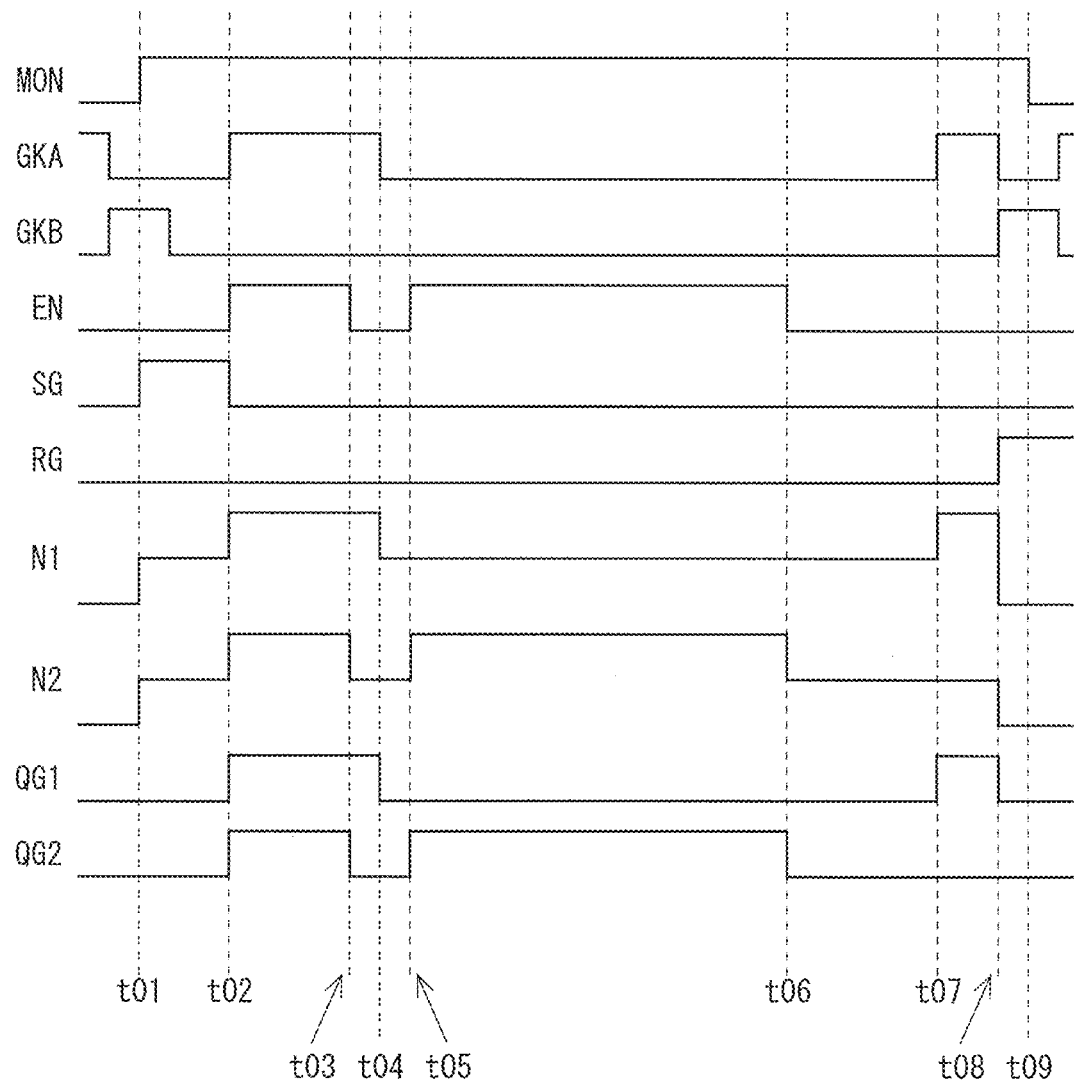
FIG. 8 is a signal waveform diagram for explaining the operation of the unit circuit in the gate driver when a monitoring process is performed in the first embodiment.

The operation of the unit circuit 21(*i*) in the ith stage will be described with reference to FIG. 8. However, it is assumed that the ith row is the monitoring row, and attention is focused on an operation when the monitoring process for the ith row is performed. Immediately before time point t01, the potential of the first internal node N1 and the potential of the second internal node N2 are at the low level, and the control signal MON is at the low level.

At time point t01, the control signal MON changes from the low level to the high level. Thus, the transistor M5 is turned on. Further, at time point t01, the set signal SG changes from the low level to the high level. The transistor M1 is turned on by the pulse of the set signal SG, and the capacitor C11 is charged. At this time, with the transistor M5 being in the on-state, the capacitor C12 is also charged. From the above, the potential of the first internal node N1 increases to turn on the transistor M3, and the potential of the second internal node N2 increases to turn on the transistor M6. However, in the period from time point t01 to time point t02, since the clock signal GKA and the enable signal EN are maintained at the low level, the output signals QG1 and QG2 are maintained at the low level.

At time point t02, the clock signal GKA changes from the low level to the high level. At this time, with the transistor M3 being in the on-state, the potential of the output terminal 58 (the potential of the output signal QG1) increases as the potential of the input terminal 53 increases. Accordingly, the potential of the first internal node N1 also increases via the capacitor C11. As a result, a large voltage is applied to the control terminal of the transistor M3, and the potential of the output signal QG1 increases to a level sufficient for turning on the write control transistor T1 to which the output terminal 58 is connected. Further, at time point t02, the enable signal EN changes from the low level to the high level. At this time, with the transistor M6 being in the on-state, the potential of the output terminal 59 (the potential of the output signal QG2) increases as the potential of the input terminal 55 increases. Accordingly, the potential of the second internal node N2 also increases via the capacitor C12 (the second internal node N2 comes into the boost state). As a result, a large voltage is applied to the control terminal of the transistor M6, and the potential of the output signal QG2 increases to a level sufficient for turning on the monitoring control transistor T3 to which the output terminal 59 is connected.

At time point t03, the enable signal EN changes from the high level to the low level. Thereby, the potential of the output terminal 59 (the potential of the output signal QG2) decreases as the potential of the input terminal 55 decreases. When the potential of the output terminal 59 decreases, the potential of the second internal node N2 also decreases via the capacitor C12.

At time point t04, the clock signal GKA changes from the high level to the low level. Thereby, the potential of the output terminal 58 (the potential of the output signal QG1) decreases as the potential of the input terminal 53 decreases. When the potential of the output terminal 58 decreases, the potential of the first internal node N1 also decreases via the capacitor C11.

At time point t05, the enable signal EN changes from the low level to the high level. Thus, similarly to time point t02, the potential of the second internal node N2 and the potential of the output terminal 59 (the potential of the output signal QG2) increase.

At time point t06, the enable signal EN changes from the high level to the low level. Thereby, the potential of the output terminal 59 (the potential of the output signal QG2) decreases as the potential of the input terminal 55 decreases. Accordingly, the potential of the second internal node N2 also decreases via the capacitor C12.

At time point t07, the clock signal GKA changes from the low level to the high level. Thus, similarly to time point t02, the potential of the first internal node N1 and the potential of the output terminal 58 (the potential of the output signal QG1) increase. Note that, in the period from time point t07 to time point t08, since the enable signal EN is maintained at the low level, the potential of the second internal node N2 does not increase.

At time point t08, the clock signal GKA changes from the high level to the low level. Thereby, the potential of the output terminal 58 (the potential of the output signal QG1) decreases as the potential of the input terminal 53 decreases. Accordingly, the potential of the first internal node N1 also decreases via the capacitor C11. Further, at time point t08, the reset signal RG changes from the low level to the high level. Thus, the transistor M2 is turned on. As a result, the potentials of the first internal node N1 and the second internal node N2 go to the low level. Moreover, at time point t08, the clock signal GKB changes from the low level to the high level. Thus, the transistors M4 and M7 are turned on. As a result, the potential of the output terminal 58 (the potential of the output signal QG1) goes to the low level, and the potential of the output terminal 59 (the potential of the output signal QG2) is drawn to the low level even when noise has occurred.

At time point t09, the control signal MON changes from the high level to the low level. Thus, the transistor M5 is turned off.

In the above manner, in the pixel circuit 110 in the ith row, the write control transistor T1 is in an on-state in the period from time point t02 to time point t04 and the period from time point t07 to time point t08, and the monitoring control transistor T3 is in an on-state in the period from time point t02 to time point t03 and the period from time point t05 to time point t06. Thereby, the monitoring process for the pixel circuits 110 in the ith row is performed.

1.4 Emission Driver

<1.4.1 Configuration of Shift Register>

A detailed configuration of the emission driver 220 in the present embodiment will be described. Note that the configuration described here is an example, and it is not limited to this. Similarly to the gate driver 210, the emission driver 220 includes a shift register formed of a plurality of stages (at least n unit circuits).

Figure 9:
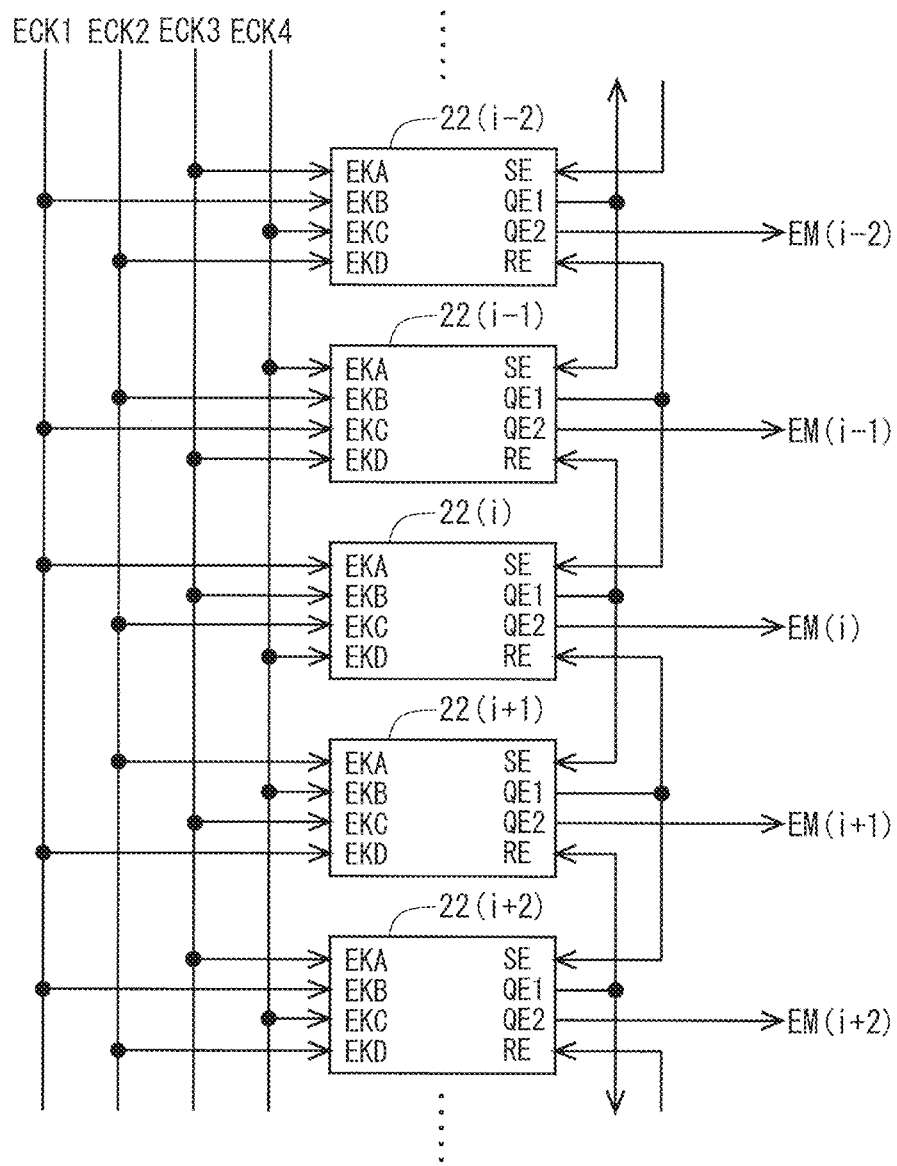
FIG. 9 is a block diagram illustrating a configuration of five stages of a shift register constituting an emission driver in the first embodiment.

FIG. 9 is a block diagram illustrating a configuration of five stages of the shift register. Again, attention is focused on the unit circuits 22(i–2) to 22(i+2) in the (i–2)th to the (i+2)th stages. The shift register is provided with a light-emission control start pulse signal and light-emission control clock signals ECK1 to ECK4 as the control signal ECTL. Note that the light-emission control start pulse signal is a signal provided to the unit circuit 22(1) in the first stage as the set signal SE and is omitted in FIG. 9.

Each unit circuit 22 includes input terminals for receiving a clock signal EKA, a clock signal EKB, a clock signal EKC, a clock signal EKD, the set signal SE, and a reset signal RE, and output terminals for outputting an output signal QE1 and an output signal QE2.

For the unit circuit 22(i–2), the light-emission control clock signal ECK3 is provided as the clock signal EKA, the light-emission control clock signal ECK1 is provided as the clock signal EKB, the light-emission control clock signal ECK4 is provided as the clock signal EKC, and the light-emission control clock signal ECK2 is provided as the clock signal EKD. For the unit circuit 22(i–1), the light-emission control clock signal ECK4 is provided as the clock signal EKA, the light-emission control clock signal ECK2 is provided as the clock signal EKB, the light-emission control clock signal ECK1 is provided as the clock signal EKC, and the light-emission control clock signal ECK3 is provided as the clock signal EKD. For the unit circuit 22(i), the light-emission control clock signal ECK1 is provided as the clock signal EKA, the light-emission control clock signal ECK3 is provided as the clock signal EKB, the light-emission control clock signal ECK2 is provided as the clock signal EKC, and the light-emission control clock signal ECK4 is provided as the clock signal EKD. For the unit circuit 22(*i*+1), the light-emission control clock signal ECK2 is provided as the clock signal EKA, the light-emission control clock signal ECK4 is provided as the clock signal EKB, the light-emission control clock signal ECK3 is provided as the clock signal EKC, and the light-emission control clock signal ECK1 is provided as the clock signal EKD. The configuration as described above is repeated in four stages. To the unit circuit 22 in each stage, the output signal QE1 from the unit circuit 22 in the previous stage is provided as the set signal SE, and the output signal QE1 from the unit circuit 22 in the subsequent stage is provided as the reset signal RE. The output signal QE1 from the unit circuit 22 in each stage is provided to the unit circuit 22 in the preceding stage as the reset signal RE and is provided to the unit circuit 22 in the subsequent stage as the set signal SE. The output signal QE2 from the unit circuit 22 in each stage is provided as a light-emission control signal to the corresponding light-emission control line EM. Note that, as illustrated in FIG. 5, the light-emission control line EM is connected to the control terminal of the light-emission control transistor T4 in the pixel circuit 110.

<1.4.2 Configuration of Unit Circuit>

Figure 10:
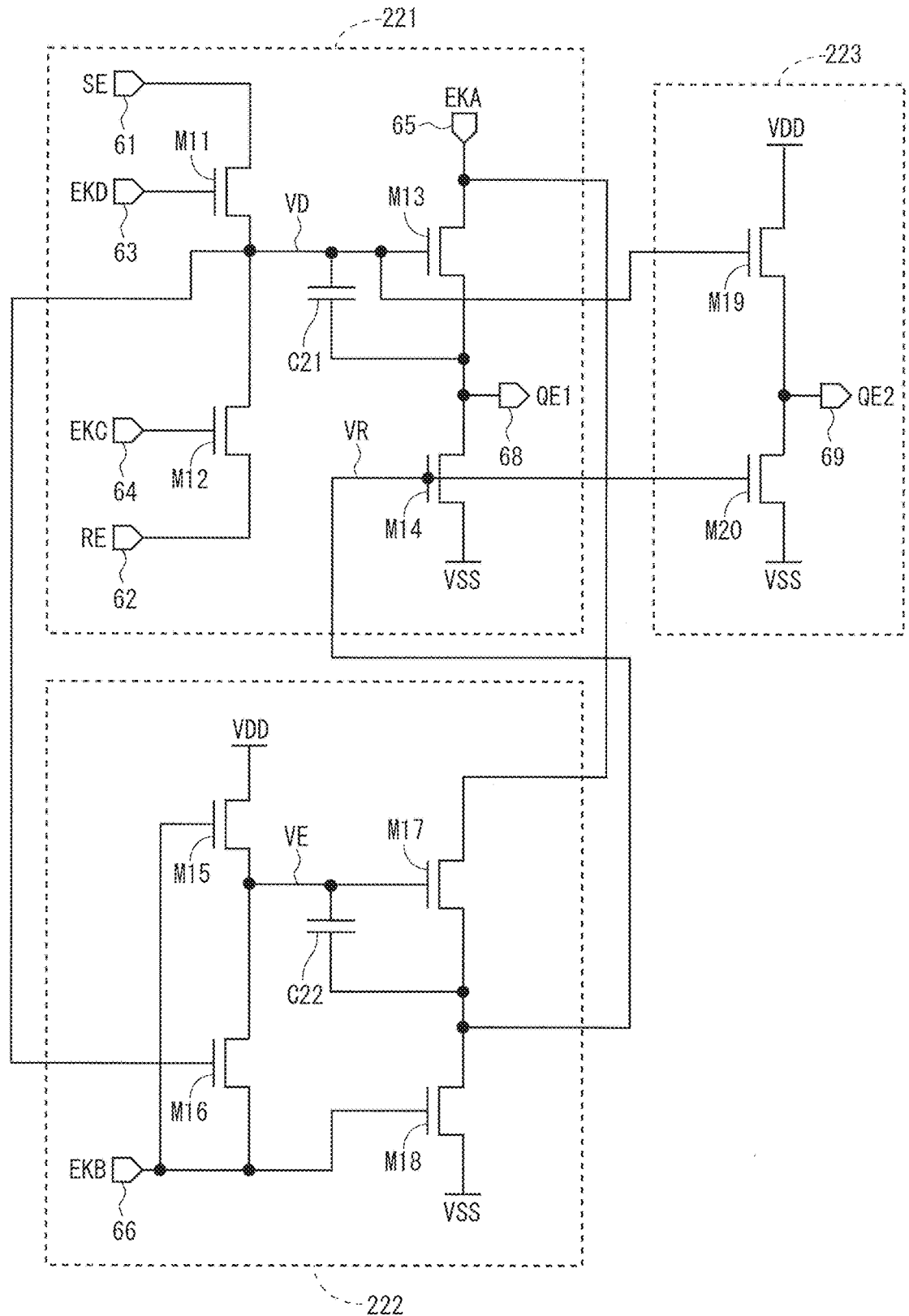
FIG. 10 is a circuit diagram illustrating a configuration of a unit circuit in the emission driver in the first embodiment.

FIG. 10 is a circuit diagram illustrating the configuration of the unit circuit 22. As illustrated in FIG. 10, the unit circuit 22 includes ten transistors M11 to M20 and two capacitors C21, C22. Further, the unit circuit 22 includes six input terminals 61 to 66 and two output terminals 68, 69 in addition to an input terminal connected to the first reference potential line described above and an input terminal connected to a power line (hereinafter referred to as a "second reference potential line") to which a high-level potential VDD is applied. In FIG. 10, an input terminal for receiving the set signal SE is denoted by reference numeral 61, an input terminal for receiving the reset signal RE is denoted by reference numeral 62, an input terminal for receiving the clock signal EKD is denoted by reference numeral 63, an input terminal for receiving the clock signal EKC is denoted by reference numeral 64, an input terminal for receiving the clock signal EKA is denoted by reference numeral 65, an input terminal for receiving the clock signal EKB is denoted by reference numeral 66, an output terminal for outputting the output signal QE1 is denoted by reference numeral 68, and an output terminal for outputting the output signal QE2 is denoted by reference numeral 69.

The second conduction terminal of the transistor M11, the first conduction terminal of the transistor M12, the control terminal of the transistor M13, the control terminal of the transistor M16, the control terminal of the transistor M19, and one end of the capacitor C21 are connected to each other. Note that an area (wiring) where these are connected to each other is referred to as a "first control node". The first control node is denoted by reference sign VD. The second conduction terminal of the transistor M15, the first conduction terminal of the transistor M16, the control terminal of the transistor M17, and one end of the capacitor C22 are connected to each other. Note that an area (wiring) where these are connected to each other is referred to as a "second control node". The second control node is denoted by reference sign VE. The control terminal of the transistor M14, the second conduction terminal of the transistor M17, the first conduction terminal of the transistor M18, the control terminal of the transistor M20, and the other end of the capacitor C22 are connected to each other. Note that an area (wiring) where these are connected to each other is referred to as a "third control node". The third control node is denoted by reference sign VR.

Meanwhile, the unit circuit 22 includes a set circuit 221, a reset circuit 222, and a buffer circuit 223. The set circuit 221 includes transistors M11 to M14 and a capacitor C21. The reset circuit 222 includes transistors M15 to M18 and a capacitor C22. The buffer circuit 223 includes transistors M19, M20.

The transistor M11 has a control terminal connected to the input terminal 63, a first conduction terminal connected to the input terminal 61, and a second conduction terminal connected to the first control node VD. The transistor M12 has a control terminal connected to the input terminal 64, a first conduction terminal connected to the first control node VD, and a second conduction terminal connected to the input terminal 62. The transistor M13 has a control terminal connected to the first control node VD, a first conduction terminal connected to the input terminal 65, and a second conduction terminal connected to the output terminal 68. The transistor M14 has a control terminal connected to the third control node VR, a first conduction terminal connected to the output terminal 68, and a second conduction terminal connected to the first reference potential line. The transistor M15 has a control terminal connected to the input terminal 66, a first conduction terminal connected to the second reference potential line, and a second conduction terminal connected to the second control node VE. The transistor M16 has a control terminal connected to the first control node VD, a first conduction terminal connected to the second control node VE, and a second conduction terminal connected to the input terminal 66. The transistor M17 has a control terminal connected to the second control node VE, a first conduction terminal connected to the input terminal 65, and a second conduction terminal connected to the third control node VR. The transistor M18 has a control terminal connected to the input terminal 66, a first conduction terminal connected to the third control node VR, and a second conduction terminal connected to the first reference potential line. The transistor M19 has a control terminal connected to the first control node VD, a first conduction terminal connected to the second reference potential line, and a second conduction terminal connected to the output terminal 69. The transistor M20 has a control terminal connected to the third control node VR, a first conduction terminal connected to the output terminal 69, and a second conduction terminal connected to the first reference potential line. The capacitor C21 has one end connected to the first control node VD and the other end connected to the output terminal 68. The capacitor C22 has one end connected to the second control node VE and the other end connected to the third control node VR.

In the present embodiment, a first control node set transistor is achieved by the transistor M11, a first control node reset transistor is achieved by the transistor M12, a first output control transistor is achieved by the transistor M13, a second control node set transistor is achieved by the transistor M15, a second control node reset transistor is achieved by the transistor M16, an internal control transistor is achieved by the transistor M17, a third control node reset transistor is achieved by the transistor M18, a second output control transistor is achieved by the transistor M19, a first boost capacitance is achieved by the capacitor C21, a second boost capacitance is achieved by the capacitor C22, a first output terminal is achieved by the output terminal 68, and a second output terminal is achieved by the output terminal 69.

<1.4.3 Operation of Unit Circuit>

Figure 11:
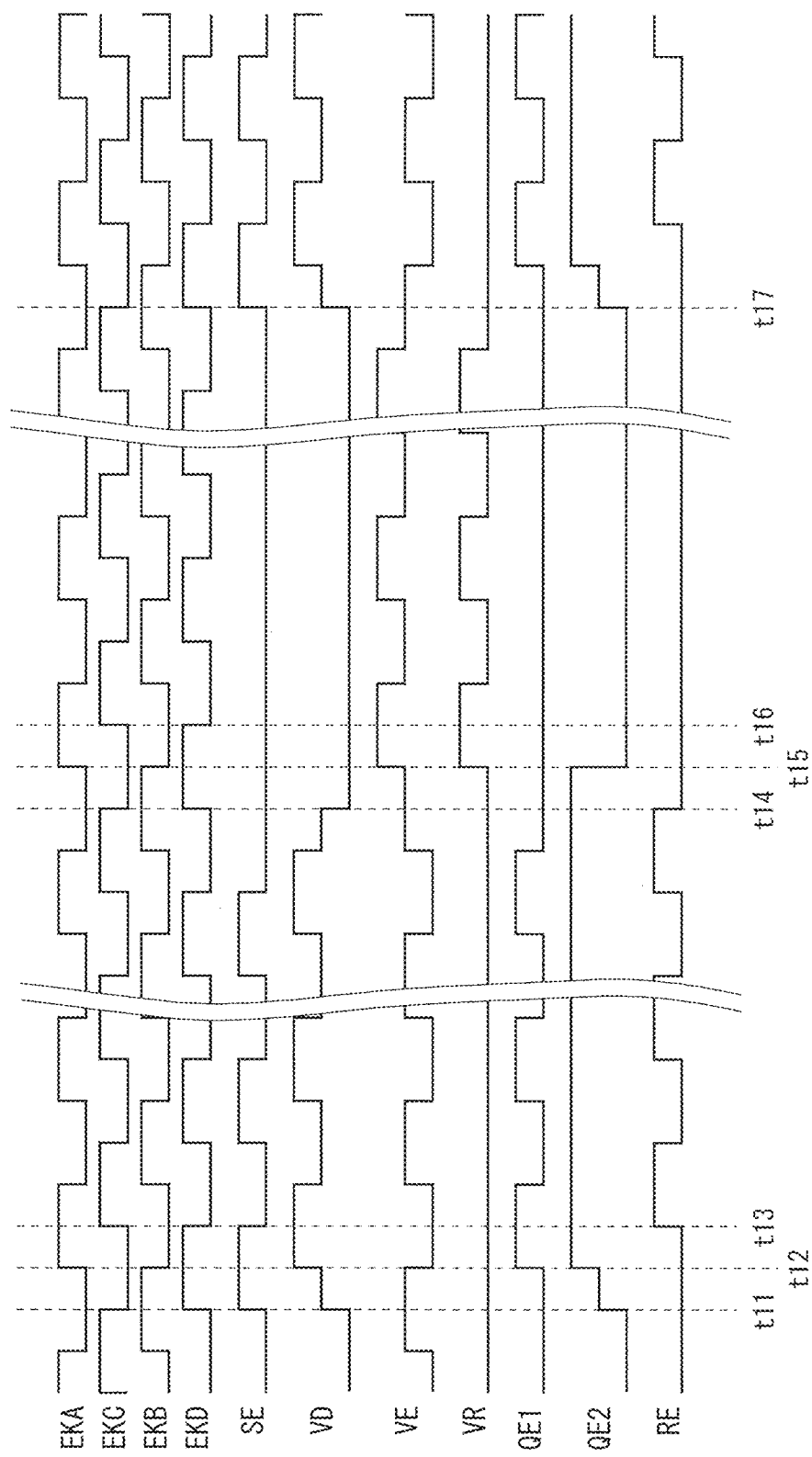
FIG. 11 is a signal waveform diagram for explaining the operation of the unit circuit in the emission driver in the first embodiment.

The operation of the unit circuit 22(*i*) in the ith stage will be described with reference to FIG. 11. Immediately before time point t11, the potential of the first control node VD and the potential of the third control node VR are at the low level, and the potential of the second control node VE is at the high level (pre-charge state).

At time point t11, the clock signal EKD changes from the low level to the high level. Thus, the transistor M11 is turned on. Further, at time point t11, the set signal SE changes from the low level to the high level. Thus, the capacitor C21 is charged. Thereby, the potential of the first control node VD increases (the first control node VD enters the pre-charge state) to turn on the transistors M13, M16, M19. Although the transistor M13 is turned on as described above, in the period from time point t11 to time point t12, since the clock signal EKA is maintained at the low level, the potential of the output terminal 68 (the potential of the output signal QE1) is maintained at the low level. Further, with the high-level potential VDD being applied to the first conduction terminal of the transistor M19, the potential of the output terminal 69 (the potential of the output signal QE2) increases by the turn-on of the transistor M19 at time point t11.

As illustrated in FIG. 10, the high-level potential VDD is applied to the first conduction terminal of the transistor M15, the clock signal EKB is applied to the second conduction terminal of the transistor M16, and the low-level potential VSS is applied to the second conduction terminal of the transistor M18. Here, in the period from time point t11 to time point t12, the clock signal EKB is at the high level, and the first control node VD is in the pre-charge state as described above. From the above, during this period, the potential of the second control node VE is maintained at the high level (pre-charge state), and the potential of the third control node VR is maintained at the low level.

At time point t12, the clock signal EKA changes from the low level to the high level. At this time, with the transistor M13 being in the on-state, the potential of the output terminal 68 (the potential of the output signal QE1) increases as the potential of the input terminal 65 increases. Accordingly, the potential of the first control node VD also increases via the capacitor C21 (the first control node VD comes into the boost state). As a result, a large voltage is applied to the control terminal of the transistor M13, and the potential of the output terminal 68 (the potential of the output signal QE1) increases sufficiently. Furthermore, a large voltage is also applied to the control terminal of the transistor M19, so that the potential of the output terminal 69 (the potential of the output signal QE2) increases sufficiently.

Further, at time point t12, the clock signal EKB changes from the high level to the low level. At this time, the transistor M16 is in the on-state. Thereby, the potential of the second control node VE goes to the low level, and the transistor M17 is turned off. With the transistor M17 being turned off in this manner, the potential of the third control node VR is maintained at the low level even when the clock signal EKA changes from the low level to the high level at time point t12.

In the period from time point t13 to time point t14, a period in which the reset signal RE is at the high level and the clock signal EKC is at the high level and a period in which the set signal SE is at the high level and the clock signal EKD is at the high level are repeated alternately. Hence the potential of the first control node VD is maintained at the high level. The potential of the first control node VD fluctuates up and down in synchronization with the clock signal EKA. That is, the first control node VD alternately repeats the pre-charge state and the boost state. Therefore, the potential of the output terminal 68 (the potential of the output signal QE1) alternately repeats the high level and the low level in synchronization with the clock signal EKA. With the high-level potential VDD being applied to the first conduction terminal of the transistor M19, the potential of the output terminal 69 (the potential of the output signal QE2) is maintained at a sufficiently high level.

In addition, in the period from time point t13 to time point t14, since the potential of the first control node VD is maintained at the high level as described above, the potential of the second control node VE goes to the high level (pre-charge state) in the period in which the clock signal EKB is at the high level, and the potential of the second control node VE goes to the low level in the period in which the clock signal EKB is at the low level. Thereby, the transistor M17 alternately repeats the on-state and the off-state. Here, in a period in which the potential of the second control node VE is at the high level, the clock signal EKA is maintained at the low level. Therefore, in the period from time point t13 to time point t14, the second control node VE is not in the boost state, and the potential of the third control node VR is maintained at the low level.

At time point t14, although the clock signal EKD changes from the low level to the high level, the set signal SE is maintained at the low level. Thus, the potential of the first control node VD goes to the low level. Thereby, the transistors M13, M16, M19 are turned off. With the transistor M16 being turned off, the potential of the second control node VE is maintained at the high level (pre-charge state). At this time, since the clock signal EKA is at the low level, the potential of the third control node VR is maintained at the low level. Therefore, the transistor M20 is maintained in the off-state, and the potential of the output terminal 69 (the potential of the output signal QE2) is maintained at a sufficiently high level.

At time point t15, the clock signal EKA changes from the low level to the high level. At this time, the transistor M17 is in the on-state, and the capacitor C22 exists between the control terminal and the second conduction terminal of the transistor M17, so that the second control node VE is in the boost state due to the increase in the potential of the input terminal 65. Thus, the potential of the third control node VR sufficiently increases, and the transistors M14, M20 are turned on. By the turn-on of the transistor M14, the potential of the output terminal 68 (the potential of the output signal QE1) is drawn to the low level even when noise has occurred. By the turn-on of the transistor M20, the potential of the output terminal 69 (the potential of the output signal QE2) goes to the low level.

In the period from time point t16 to time point t17, the potential of the first control node VD is maintained at the low level, whereby the transistor M16 is maintained in the off-state. Thus, the potential of the second control node VE fluctuates up and down in synchronization with the clock signal EKA. That is, the second control node VE alternately repeats the pre-charge state and the boost state. Therefore, the potential of the third control node VR alternately repeats the high level and the low level in synchronization with the clock signal EKA. During this period, the transistors M13, M19 are maintained in the off-state, and hence the potential of the output terminal 68 (the potential of the output signal QE1) and the potential of the output terminal 69 (the potential of the output signal QE2) are maintained at the low level.

1.5 Monitoring Process

Figure 12:
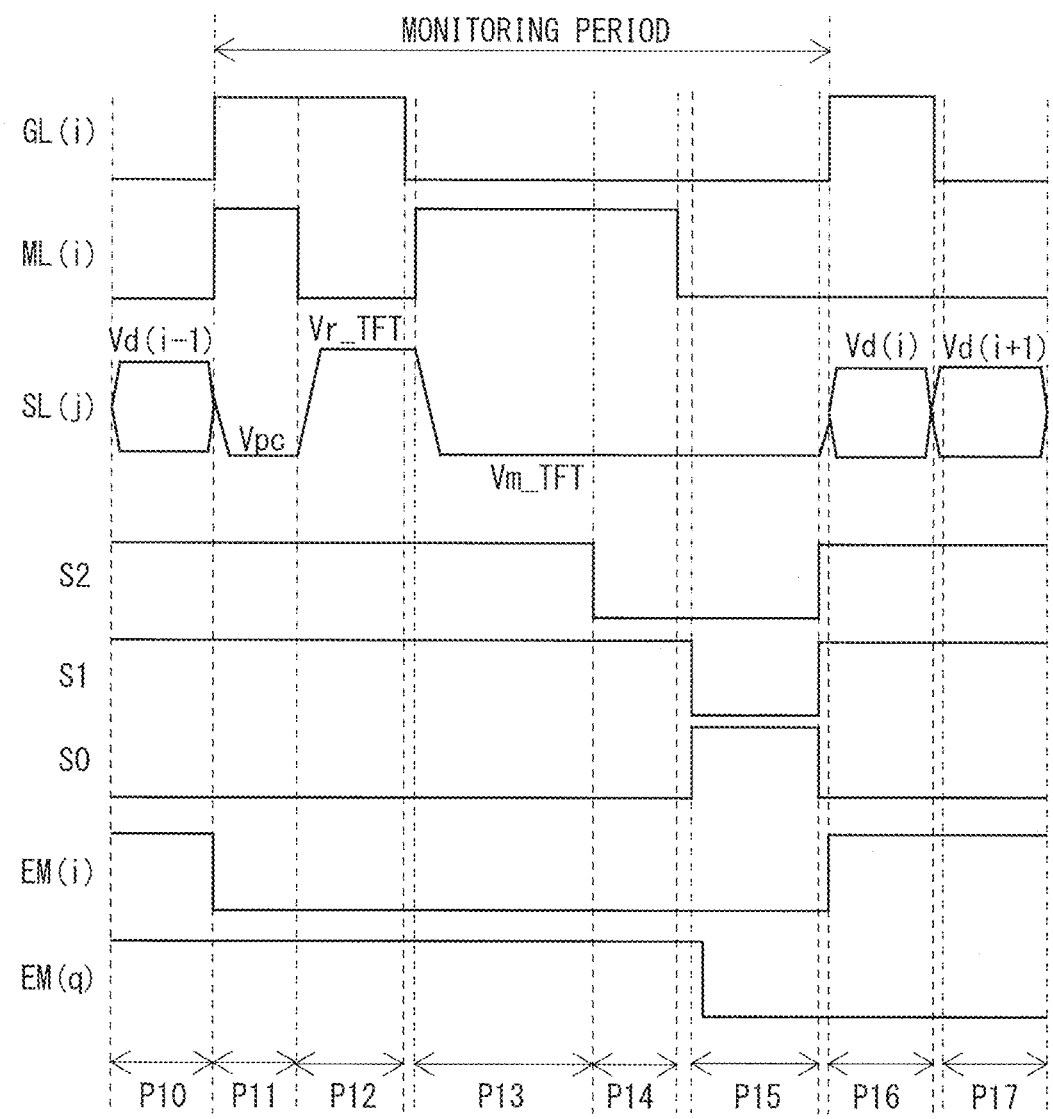
FIG. 12 is a signal waveform diagram for explaining the operations of the pixel circuit and the current monitoring unit when the monitoring process is performed in the first embodiment.

Next, the operations of the pixel circuit 110 and the current monitoring unit 320 when the monitoring process is performed will be described with reference to FIG. 12. Here, it is assumed that the ith row is the monitoring row, and attention is focused on the pixel circuit 110 in the ith row and the jth column and the current monitoring unit 320 corresponding to the jth column. Also, here, attention is focused on a case where the TFT characteristic is detected by the monitoring process. Note that the correspondence relationship between each time point in FIG. 8 and the period in FIG. 12 is as follows.

Time point t01: start point of period P10
Time point t02: start point of period P11
Time point t03: start point of period P12
Time point t04: end point of period P12
Time point t05: start point of period P13
Time point t06: end point of period P14
Time point t07: start point of period P16
Time point t08: end point of period P16
Time point t09: intermediate point of period P17

In period P10, writing based on a data potential Vd (i−1) for image display is performed in the (i−1)th row. Immediately before the end point of period P10, the scanning signal GL(i) and the monitoring control signal ML(i) are at the low level. Thus, the write control transistor T1 and the monitoring control transistor T3 are in the off-state. Further, immediately before the end point of period P10, the light-emission control signal EM(i) is at the on-level. Thus, the light-emission control transistor 14 is in the on-state, and a drive current is supplied to the organic EL element L1. Moreover, immediately before the end point of period P10, the control signals S2, S1 are at the high level, and the control signal S0 is at the low level. Thus, the switches 323, 324 are in the on-state, and the switch 325 is in the off-state. At this time, the data signal line SL(j) and the internal data line Sin(j) are connected electrically.

When period P11 is reached, a light-emission control signal EM(i) changes from a high level to a low level. Thus, the light-emission control transistor T4 is turned off, and the supply of the drive current to the organic EL element L1 is stopped. Further, when period P11 is reached, the scanning signal GL(i) and the monitoring control signal ML(i) change from the low level to the high level. Thus, the write control transistor T1 and the monitoring control transistor T3 are turned on. In period P11, the initialization potential Vpc for initializing the state of the pixel circuit 110 is applied to the data signal line SL(j) in the state as described above. Thereby, the state of the capacitor C and the potential of the node 111 are initialized. Note that the timing at which the light-emission control signal EM(i) changes from the high level to the low level and the timing at which the scanning signal GL(i) and the monitoring control signal ML(i) change from the low level to the high level are not necessarily exactly the same timing.

When period P12 is reached, the monitoring control signal ML(i) changes from the high level to the low level. Thereby, the monitoring control transistor T3 is turned off. In this state, a characteristic detection potential Vr_TFT is applied to the data signal line SL(j). The characteristic detection potential Vr_TFT is a potential set such that a current flows through the drive transistor T2 but no current flows through the organic EL element L1. That is, in period P12, the drive transistor T2 is turned on.

When period P13 is reached, the scanning signal GL(i) changes from the high level to the low level, and the monitoring control signal ML(i) changes from the low level to the high level. Thus, the write control transistor T1 is turned off, and the monitoring control transistor T3 is turned on. In such a state, a current measurement potential Vm_TFT is applied to the data signal line SL(j). As a result, the current flowing through the drive transistor T2 flows to the current monitoring unit 320 via the monitoring control transistor T3 and the data signal line SL(j). At this time, with the control signal S2 being at the high level, the switch 323 is in the on-state, and no charge is accumulated in the capacitor 322. Note that period P13 is set to a length sufficient to stabilize the current (measurement current) flowing through the data signal line SL(j).

When period P14 (integration period) is reached, the control signal S2 changes from the high level to the low level. Thus, the switch 323 is turned off, and the operational amplifier 301 and the capacitor 322 function as the integration circuit. As a result, the output voltage of the operational amplifier 301 becomes a voltage corresponding to the current flowing through the data signal line SL(j).

When period P15 is reached, the control signal S1 changes from the high level to the low level, and the control signal S0 changes from the low level to the high level. Thereby, the switch 324 is turned off, and the switch 325 is turned on. By the turn-off of the switch 324, the data signal line SL(j) and the internal data line Sin(j) are electrically disconnected from each other. In this state, the output voltage (monitor data MEW of the operational amplifier 301 is converted into monitor data MOd, which is digital data, by the A/D converter 31. Thus, the detection of the TFT characteristic for the ith row is completed. Note that the monitor data MOd after the A/D conversion is used to correct a digital video signal.

Thereafter, when period P16 is reached, the light-emission control signal EM(i) changes from the low level to the high level. Thereby, the light-emission control transistor T4 is turned on. Further, when period P16 is reached, the control signals S2, S1 change from the low level to the high level, and the control signal S0 changes from the high level to the low level. Thus, the switches 323, 324 is turned on, and the switch 325 is turned off. Moreover, in period P16, the scanning signal GL(i) changes from the low level to the high level. Thereby, the write control transistor T1 is turned on. The data potential Vd (i) for image display is applied to the data signal line SL(j) in the state as described above, and writing based on the data potential Vd (i) is performed in the pixel circuit 110 in the ith row and the jth column. As a result, the organic EL element L1 emits light.

When period P17 is reached, the scanning signal GL(i) changes from the high level to the low level. Thus, the write control transistor T1 is turned off. Note that, in period P17, writing based on the data potential Vd (i+1) for image display is performed in an (i+1)th row. In the period after period P17, in the pixel circuit 110 in the ith row and the jth column, the organic EL element L1 emits light on the basis of writing in period P16.

In the present embodiment, the monitoring process for detecting the TFT characteristic is performed as described above. Note that period P12 corresponds to a measurement write period, and period P14 (integration period) corresponds to a current measurement period.

1.6 Method for Controlling Light-Emission Control Line

Figure 1:
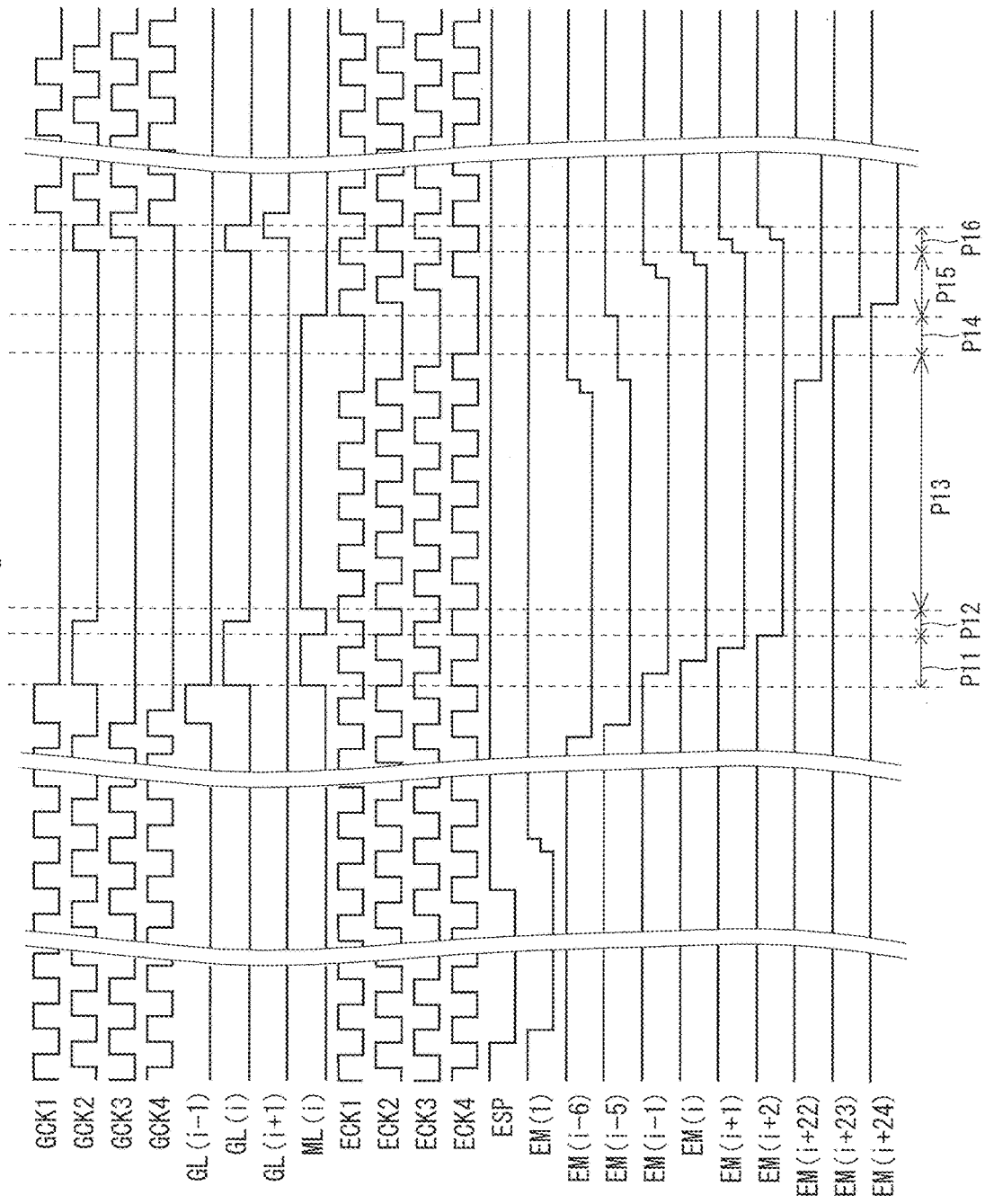
FIG. 1 is a signal waveform diagram for explaining a method for controlling a light-emission control line in a first embodiment.

Next, a method for controlling the light-emission control line EM will be described with reference to FIG. 1. Again, it is assumed that the ith row is the monitoring row. In a period until the monitoring period is started, the light-emission control signal EM sequentially becomes the low level for a predetermined period row by row. After the start of the monitoring period, at a time point slightly before the end point of period P13 (a period for stabilizing the measurement current), the display control circuit 40 sequentially stops the outputs of the light-emission control clock signals ECK1 to ECK4 one by one as illustrated in FIG. 1. In other words, the display control circuit 40 sequentially stops the outputs of the light-emission control clock signals ECK1 to ECK4 one by one, by the start point of the integration period P14. The state in which the outputs of the light-emission control clock signals ECK1 to ECK4 are stopped is continued until the end point of the integration period P14. Thereby, each of the light-emission control signals applied to the plurality of light-emission control lines EM(1) to EM(n) is maintained at the high level (on-level) or a low level (off-level) through the integration period P14. Therefore, there is no light-emission control signal that changes from the high level to the low level during the integration period P14 or no light-emission control signal that changes from the low level to the high level during the integration period P14. When the integration period P14 ends, the display control circuit 40 restarts the outputs of the light-emission control clock signals ECK1 to ECK4.

Note that, when the OLED characteristic is detected by the monitoring process, each of the light-emission control signals applied to the plurality of light-emission control lines EM(1) to EM(n) is maintained at the high level. This is because it is necessary to allow a current to flow through the organic EL element L1 in order to detect the OLED characteristic, and the light-emission control transistor T4 needs to be maintained in the on-state.

1.7 Effects

Figure 26:
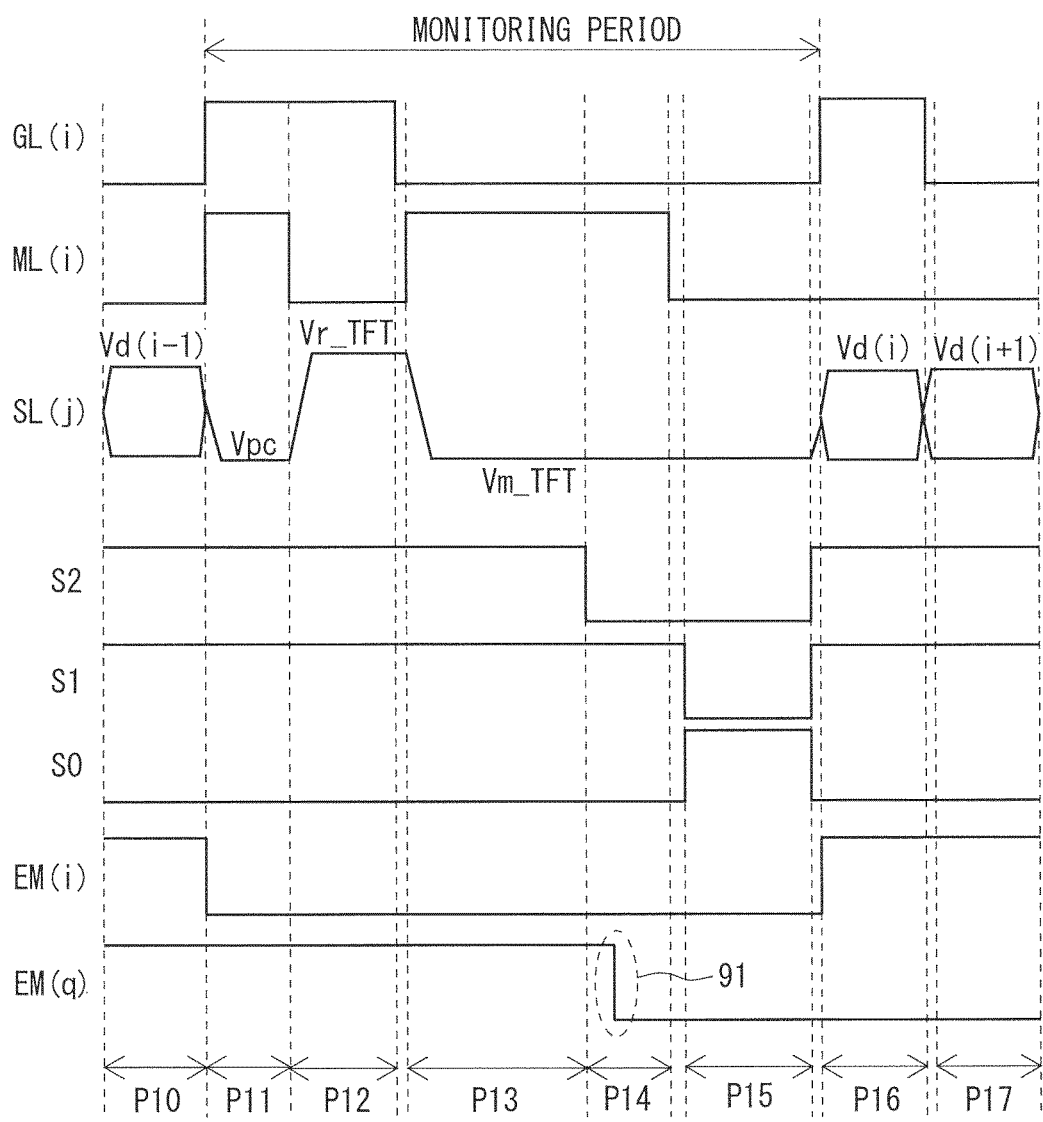
FIG. 26 is a signal waveform diagram for explaining an operation during a monitoring period in a case where a TFT characteristic is detected regarding the related art.
Figure 27:
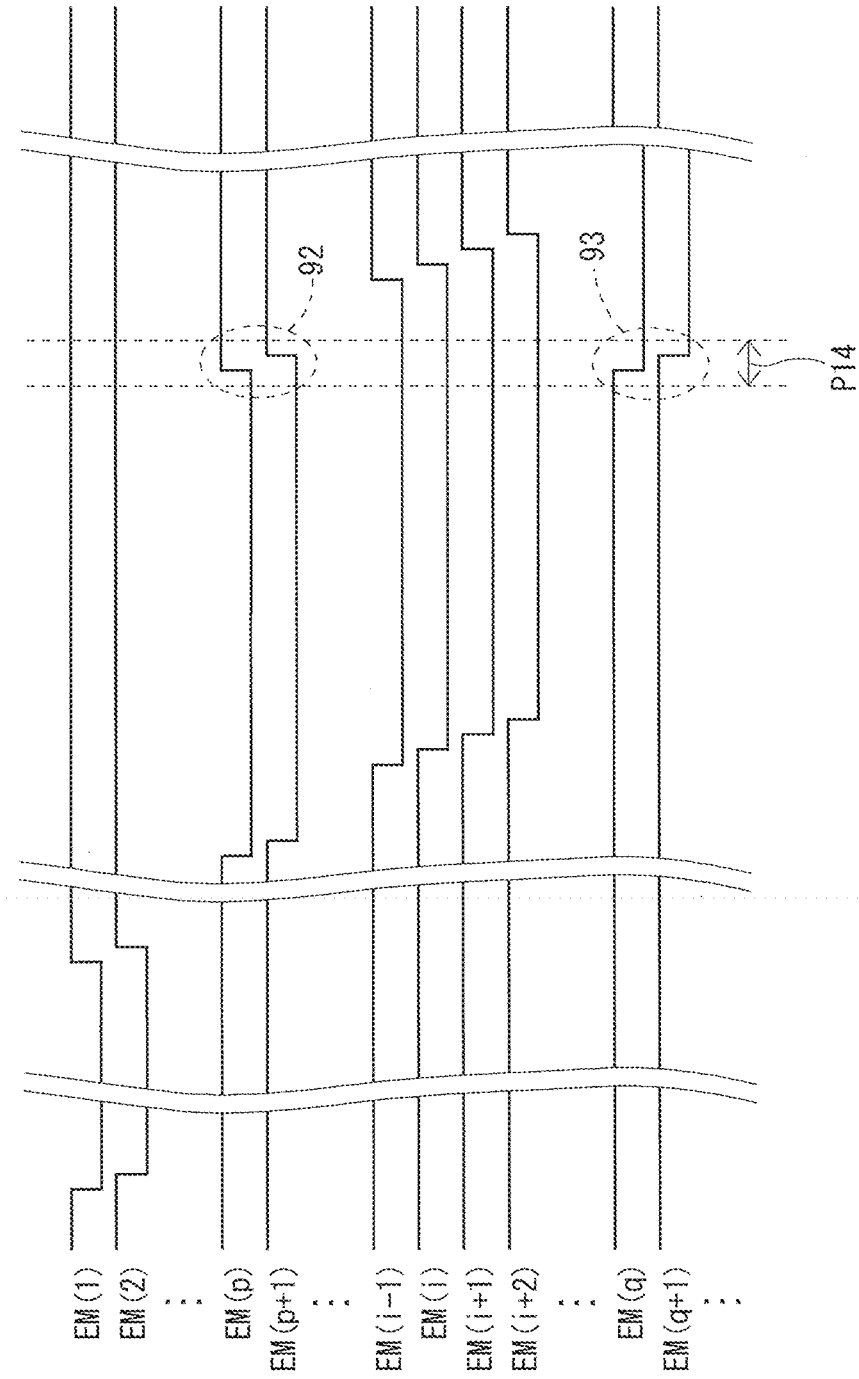
FIG. 27 is a signal waveform diagram for explaining that there is a light-emission control signal the level of which changes during an integration period regarding the related art.

According to the present embodiment, the display control circuit 40 stops the outputs of the light-emission control clock signals ECK1 to ECK4 throughout the integration period P14. Therefore, each of the light-emission control signals applied to the light-emission control lines EM(1) to EM(n) disposed in the display unit 10 is maintained at the high level or the low level throughout the integration period P14. For example, regarding the light-emission control signal EM(q) the level of which has changed during the integration period P14 as illustrated in FIG. 26 in the related art, the level thereof changes before the start of the integration period P14 or after the end of the integration period P14 in the present embodiment (cf. FIG. 12). Since each light-emission control signal is maintained at a constant level throughout the integration period P14 in this manner, coupling noise due to the presence of a parasitic capacitance between the light-emission control line EM in the non-monitoring row and the data signal line SL does not occur during the integration period P14. Therefore, the current corresponding to the characteristic of the drive transistor T2 is accurately detected at the time of the monitoring process. As above, according to the present embodiment, in the organic EL display device having the external compensation function, the degradation of the compensation accuracy caused by the coupling noise generated in the data signal line SL is prevented.

1.8 Modification

In the above first embodiment, the data signal lines SL(1) to SL(m) have been used not only for transmitting data signals for image display, but have also been used as signal lines for causing the current corresponding to the characteristic of the drive transistor T2 or the organic EL element L1 to flow at the time of the monitoring process. However, it is not limited to this, and the configuration may be such that a signal line (hereinafter referred to as a "current monitoring line") MCL for causing the current corresponding to the characteristic of the drive transistor T2 or the organic EL element L1 to flow at the time of the monitoring process is provided in addition to the data signal lines SL(1) to SL(m) as illustrated in FIG. 13.

Figure 13:
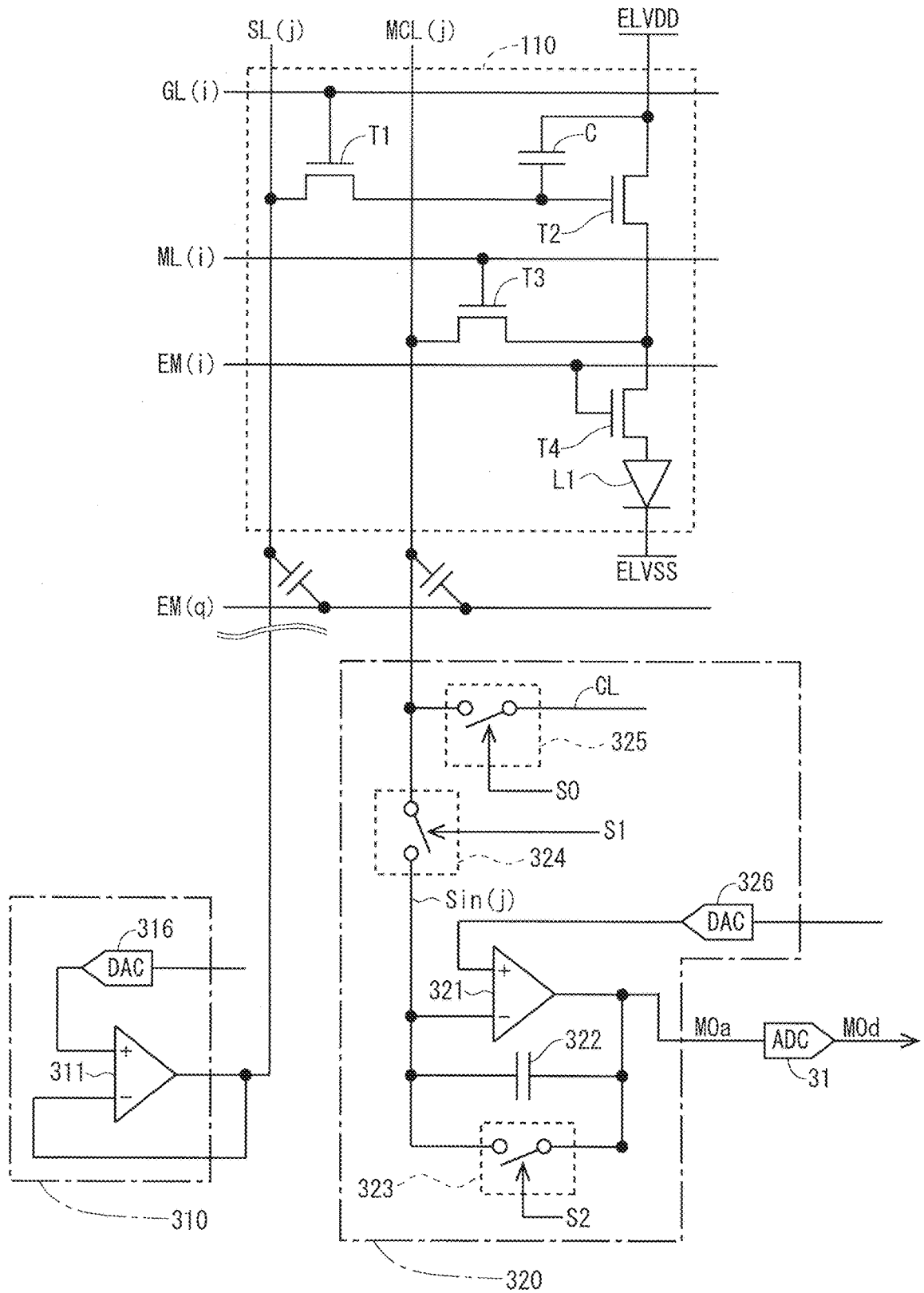
FIG. 13 is a circuit diagram illustrating a pixel circuit and a part of a source driver in a modification of the first embodiment.

FIG. 13 is a circuit diagram illustrating the pixel circuit 110 and a part of the source driver 30 in the present modification. As in the first embodiment, the pixel circuit 110 includes one organic EL element L1, four transistors T1 to 14 (write control transistor T1, drive transistor T2, monitoring control transistor T3, and light-emission control transistor T4), and one capacitor (capacitive element) C. However, the second conduction terminal of the monitoring control transistor T3 is connected to the current monitoring line MCL(j).

Regarding the source driver 30, as illustrated in FIG. 13, a portion functioning as the data signal line drive unit 310 and a portion functioning as the current monitoring unit 320 are separated. The data signal line drive unit 310 includes an operational amplifier 311 and a D/A converter 316. The current monitoring unit 320 includes a D/A converter 326, an operational amplifier 321, a capacitor 322, and three switches (switches 323, 324, and 325). Note that the operational amplifier 321 and the D/A converter 326 in FIG. 13 correspond to the operational amplifier 301 and the D/A converter 306 in FIG. 5, respectively. The operation of the current monitoring unit 320 is similar to that of the first embodiment, and hence the description thereof will be omitted. However, the current monitoring unit 320 in the present modification measures the current flowing through the current monitoring line MCL.

Also in a case where the configuration in which the current monitoring line MCL is provided separately from the data signal line SL as described above is adopted, similar effects to those of the above first embodiment can be obtained.

2. Second Embodiment

A second embodiment of the present disclosure will be described.

2.1 Concern in the First Embodiment

Figure 14:
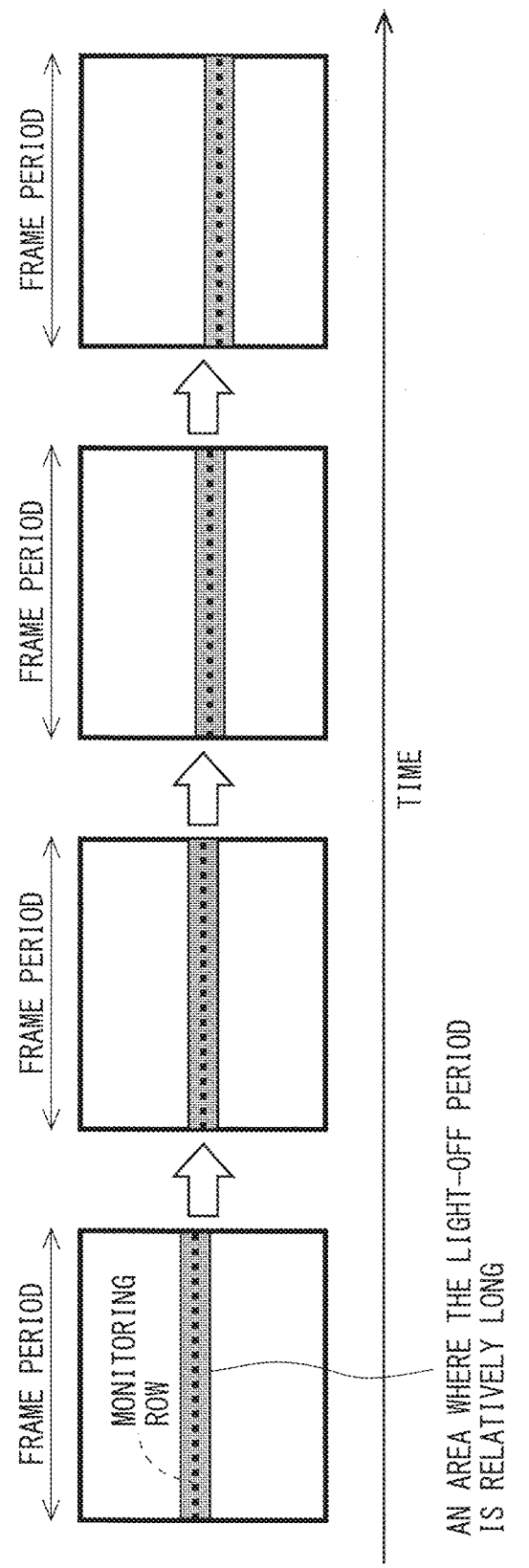
FIG. 14 is a diagram for explaining a concern in the first embodiment.

In a case where a period for stopping the outputs of the light-emission control clock signals ECK1 to ECK4 is provided as in the first embodiment, there appear a light-emission control signal EM for which an off-period (a period in which the signal is maintained at the low level) is relatively long and a light-emission control signal EM for which the off-period is relatively short. Regarding the light-emission control signal EM whose level is at the low level during the integration period P14 for the monitoring row, the off-period is relatively long. On the other hand, regarding the light-emission control signal EM whose level is at the high level during the integration period P14 for the monitoring row, the off-period is relatively short. From the above, in each frame period, there appear an area in which the light-off period is relatively long and an area in which the light-off period is relatively short. For example, in an area where the light-off period is relatively long, the organic EL element L1 is in a lighting-off state in 32 horizontal scanning periods in one frame period, and in an area where the light-off period is relatively short, the organic EL element L1 is in the lighting-off state in 28 horizontal scanning periods in one frame period. Here, when the monitoring rows are sequentially shifted row by row, an area where the light-off period is relatively long shifts as illustrated in FIG. 14. Therefore, the shift of the luminance difference between the area where the light-off period is relatively long (rows near the monitoring row) and the area where the light-off period is relatively short (rows except for the rows near the monitoring row) is easily visually recognized. In this manner, there is a concern about the degradation of display quality.

2.2 Countermeasures

Figure 15:
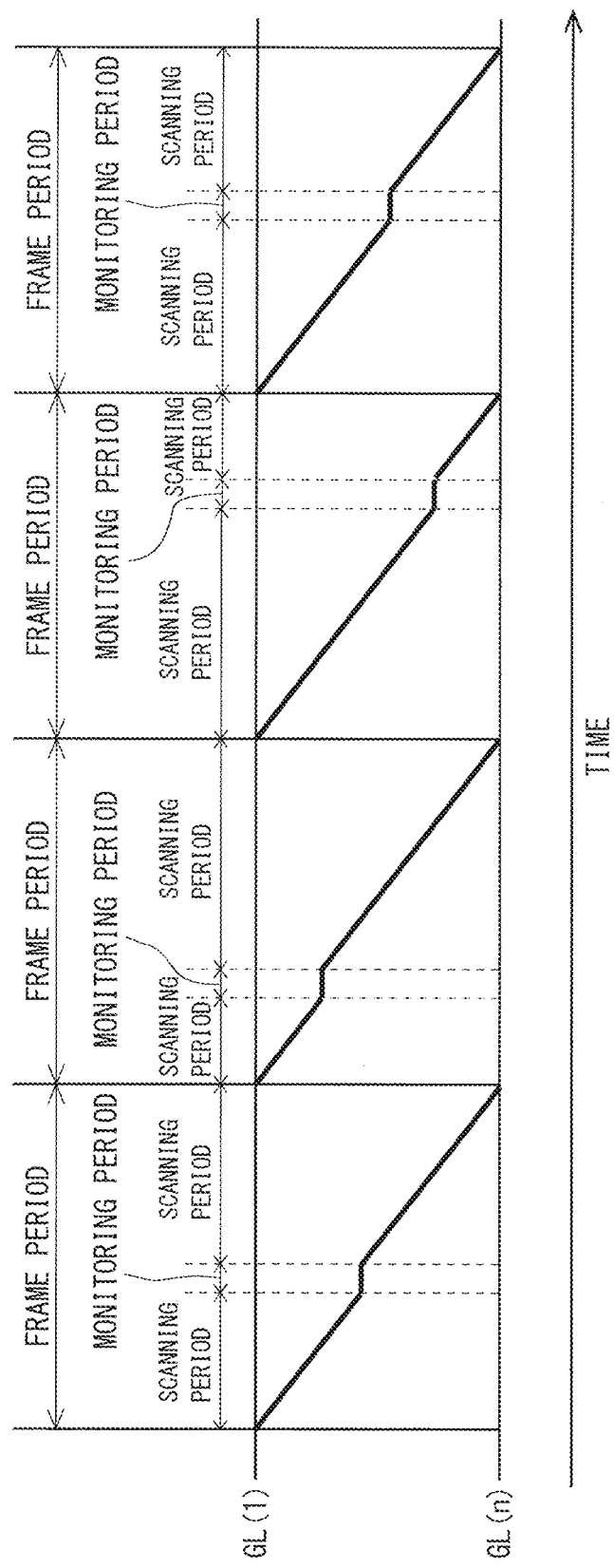
FIG. 15 is a diagram illustrating a shift of a monitoring row in a second embodiment.
Figure 16:
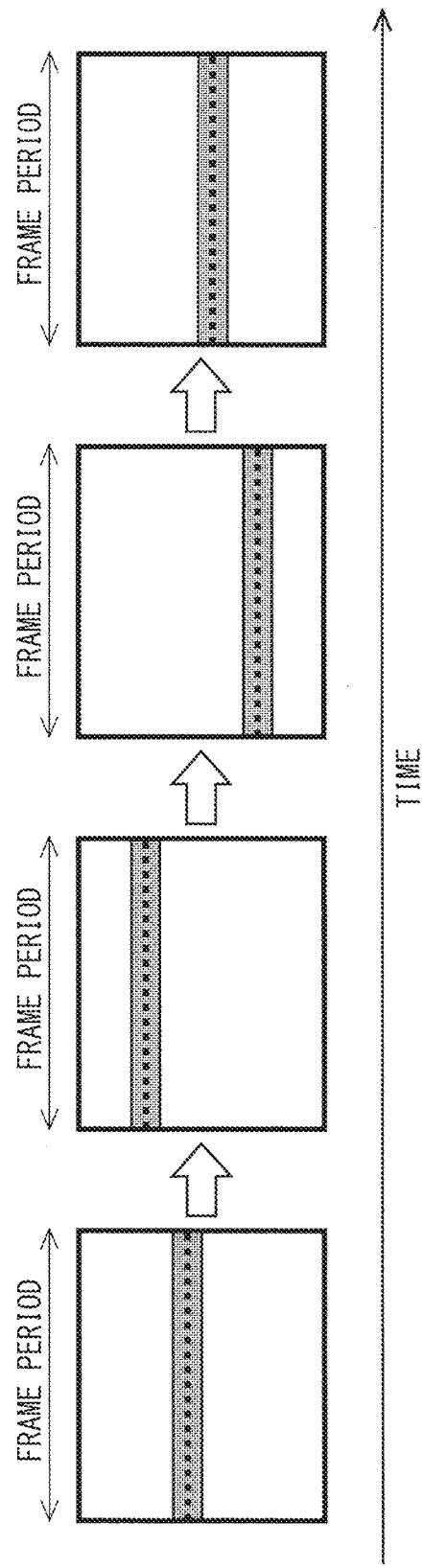
FIG. 16 is a diagram schematically illustrating a shift of an area in which a light-off period is relatively long in the second embodiment.

Therefore, in the present embodiment, the display control circuit 40 controls the operation of the scan driver 20 such that the monitoring rows appear randomly as illustrated in FIG. 15. By the monitoring rows appearing randomly, the shift of the area where the light-off period is relatively long becomes irregular as illustrated in FIG. 16. Hereinafter, a method of shifting the monitoring rows in a random order will be described.

In general, in a system using a computer, a pseudorandom function is used to generate a random state. The pseudorandom function is a function that generates a pseudorandom number. As a pseudorandom number generation algorithm, a linear congruential generator, Mersenne Twister, and the like is known. When a seed value defining the initial state is a specific value, a constant random number sequence is obtained by the pseudorandom function. Thus, even when the order of the monitoring row is determined using the pseudorandom function, as long as the seed value is a specific value, the order of the monitoring row is a regular order Therefore, in the present embodiment, the following method is adopted. Note that the configuration method for the random order described here is an example and is not limited thereto.

A plurality of patterns that define the order in which the monitoring process for a plurality of rows is performed are prepared in advance. For the convenience of description, assuming that the number of rows is six, for example, a plurality of patterns as illustrated in FIG. 17 are prepared to define the order of performing the monitoring process from the first row to the sixth row. In the example illustrated in FIG. 17, four patterns are prepared.

Under a situation where a plurality of patterns as described above is prepared, the same number of random numbers as the number of patterns, that is, a random number sequence, are generated. In the example illustrated in FIG. 17, a random number sequence made up of four random numbers is generated, the first random number is associated with pattern A, the second random number is associated with pattern B, the third random number is associated with pattern C, and the fourth random number is associated with pattern D. Then, the order obtained by arranging the random numbers in ascending order is the order in which the monitoring process is performed. If integers from 1 to 4 are generated as random numbers, a random number "2" is associated with pattern A, a random number "4" is associated with pattern B, a random number "1" is associated with pattern C, and a random number "3" is associated with pattern D, the monitoring process is performed in the order of "pattern C, pattern A, pattern D, and pattern B". Here, a random number sequence corresponding to the order of "CADB" is defined as "X1" (cf. FIG. 18).

Next, four random numbers (integers from 1 to 4) are generated using another seed value. Then, when a random number "3" is associated with pattern A, a random number "1" is associated with pattern B, a random number "4" is associated with pattern C, and a random number "2" is associated with pattern D, the monitoring process is performed in the order of "pattern B, pattern D, pattern A, and pattern C". Here, the random number sequence corresponding to the order of "B, D, A, C" is defined as "X2" (cf. FIG. 18). It is assumed that a random number sequence as illustrated in FIG. 18 is generated by repeating the same operation. In the present embodiment, a first random number sequence is achieved by random number sequences defined as "X1" to "X4".

Figure 19:
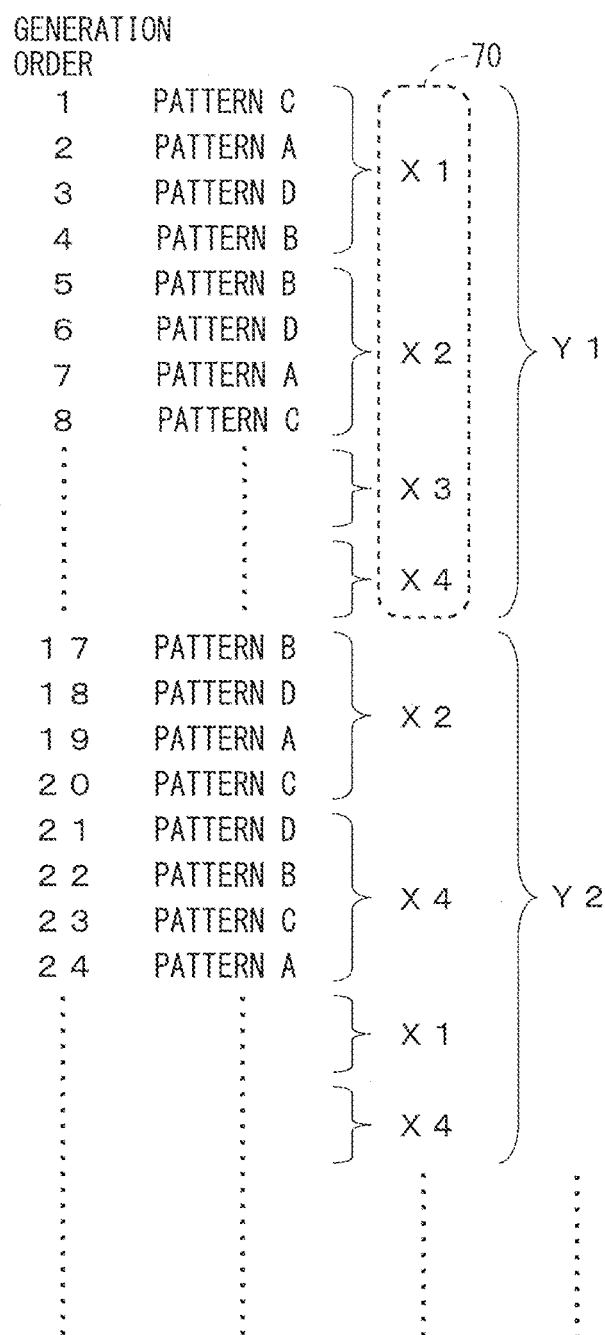
FIG. 19 is a diagram for explaining a method for making the shift of the monitoring row irregular in the second embodiment.

Next, the sorting in a portion denoted by reference numeral 70 in FIG. 19 (i.e., the sorting of the generation order of X1 to X4) is performed. Note that FIG. 19 illustrates the generation order of the plurality of patterns illustrated in FIG. 17. Again, a random number sequence made up of four random numbers is generated, and each of the four random numbers is associated with any of X1 to X4. If an integer from 1 to 4 is generated as a random number, a random number "3" is associated with X1, a random number "1" is associated with X2, a random number "4" is associated with X3, and a random number "2" is associated with X4, the monitoring process is performed in accordance with the pattern generation order corresponding to the order of "X2, X4, X1, X3". Here, when a random number sequence corresponding to an order of "X1, X2, X3, X4" is defined as "Y1" and a random number sequence corresponding to an order of "X2, X4, X1, X3" is defined as "Y2", the same operation is repeated until a random number sequence defined as "Y3" and a random number sequence defined as "Y4" are obtained as illustrated in FIG. 20. In the present embodiment, a second random number sequence is achieved by the random number sequences defined as "Y1" to "Y4".

By repeating the sorting of the patterns as described above, the shift of the monitoring row becomes extremely irregular.

In order to implement the method as described above, for example, the display control circuit 40 is provided with a pattern storage unit that holds a plurality of patterns for defining the order in which the monitoring process for a plurality of rows is performed, and a random number generation circuit that generates a first random number sequence for determining the generation order of the plurality of patterns and a second random number sequence for sorting the generation order of the plurality of patterns. Then, after the monitoring process is performed in accordance with the generation order of the plurality of patterns determined on the basis of the first random number sequence, the monitoring process is performed in accordance with the generation order of the plurality of patterns obtained by sorting based on the second random number sequence. Other configurations are similar to those of the first embodiment.

2.3 Effects

According to the present embodiment, the monitoring row shifts irregularly. For this reason, the shift of the luminance difference between the rows near the monitoring row and the other rows is hardly visually recognized. That is, the degradation of display quality is reduced. From the above, according to the present embodiment, in the organic EL display device having the external compensation function, the degradation of the compensation accuracy caused by the coupling noise generated in the data signal line SL is prevented while the degradation of the display quality is reduced.

3. Third Embodiment

3.1 Configuration

A third embodiment of the present disclosure will be described. The overall configuration, the configuration of the pixel circuit 110, the configuration of the scan driver 20 (the gate driver 210 and the emission driver 220), and the configuration of the source driver 30 are similar to those of the first embodiment, and thus, description thereof is omitted (cf. FIGS. 2 to 7, 9 and 10).

3.2 Method for Controlling Light-Emission Control Line

Figure 21:
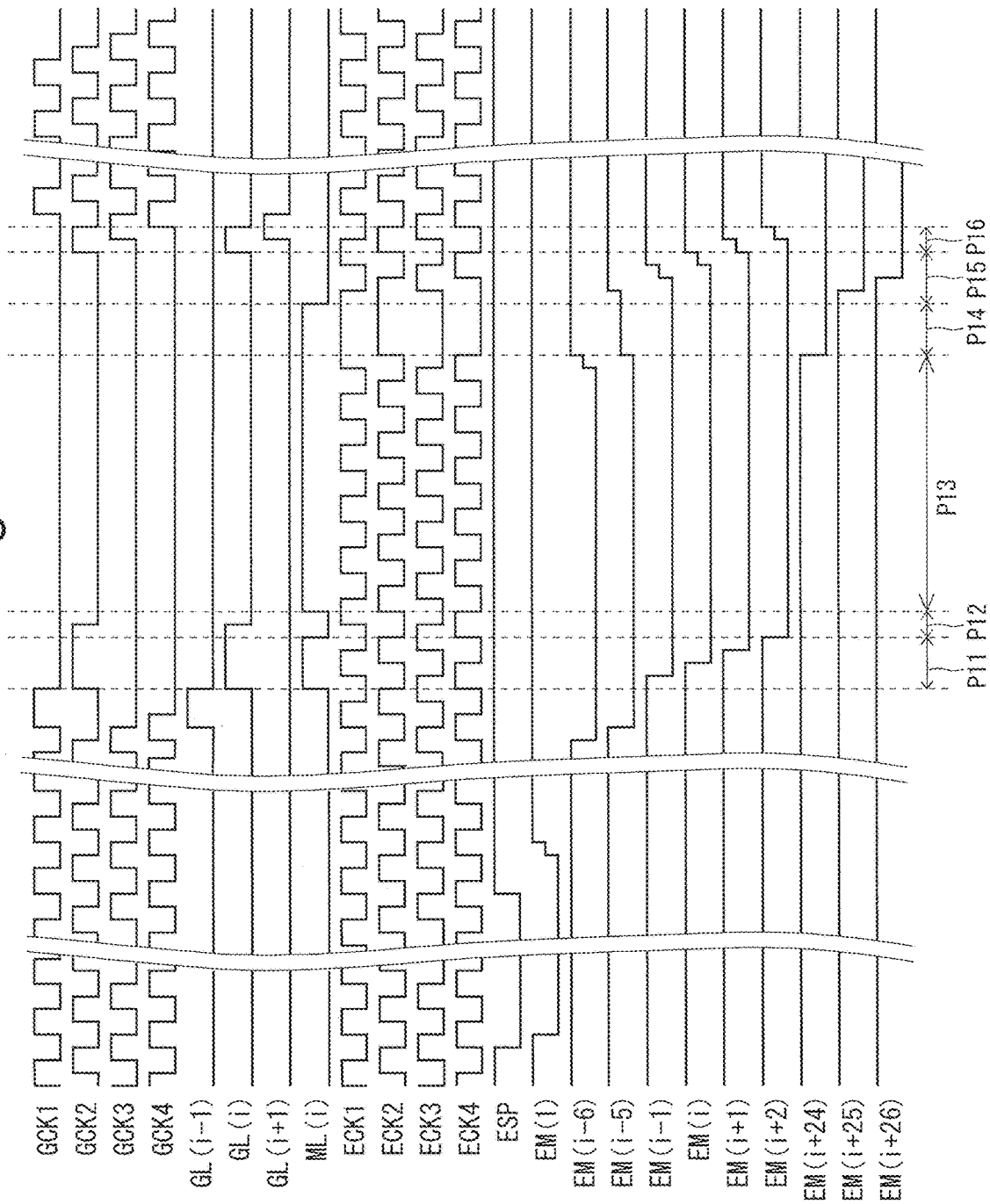
FIG. 21 is a signal waveform diagram for explaining a method for controlling a light-emission control line in a third embodiment.

A method for controlling the light-emission control line will be described with reference to FIG. 21. Similarly to the first embodiment, in the present embodiment as well, the display control circuit 40 stops the outputs of the light-emission control clock signals ECK1 to ECK4 through the integration period P14. In this regard, in the first embodiment, the display control circuit 40 has sequentially stopped the outputs of the light-emission control clock signals ECK1 to ECK4 one by one. In contrast, in the present embodiment, as illustrated in FIG. 21, the display control circuit 40 simultaneously stops the outputs of the light-emission control clock signals ECK1 to ECK4 at the start point of the integration period P14. The state in which the outputs of the light-emission control clock signals ECK1 to ECK4 are stopped is continued until the end point of the integration period P14. Then, as illustrated in FIG. 21, the display control circuit 40 simultaneously restarts the outputs of the light-emission control clock signals ECK1 to ECK4 at the end point of the integration period P14. From the above, in the present embodiment as well, each of the light-emission control signals applied to the plurality of light-emission control lines EM(1) to EM(n) is maintained at the high level (on-level) or a low level (off-level) through the integration period P14.

3.3 Unit Circuit in Emission Driver

Figure 22:
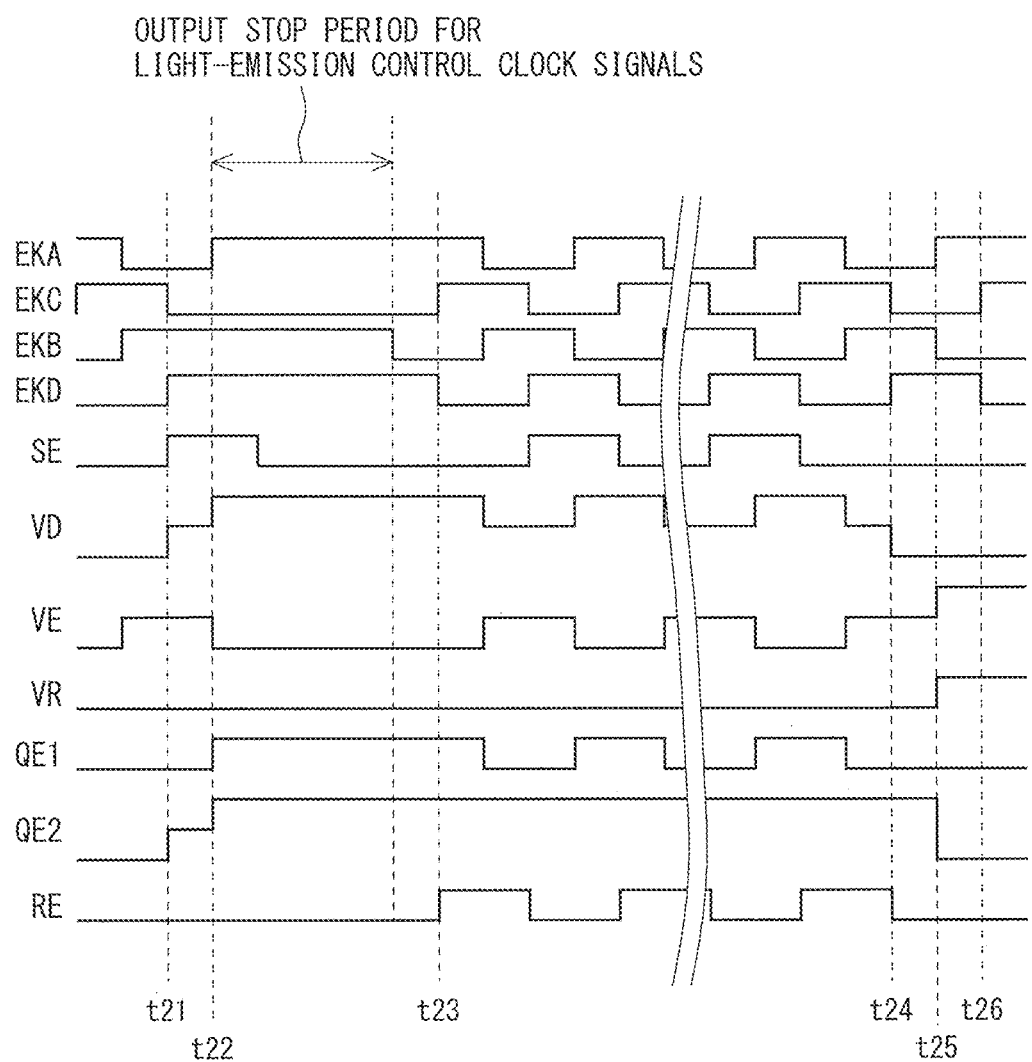
FIG. 22 is a signal waveform diagram for explaining a state of a unit circuit in a case where a configuration for stopping the output of a light-emission control clock signal is adopted in the third embodiment.

In a case where the configuration in which the outputs of the light-emission control clock signals ECK1 to ECK4 are stopped as in the present embodiment is adopted, with respect to the shift register constituting the emission driver 220, there is a unit circuit 22 in which the first control node VD is in the boost state at the output stop point for the light-emission control clock signals ECK1 to ECK4. In the unit circuit 22, the waveforms of the respective signals and the like are as illustrated in FIG. 22. Note that time point t21 to time point t26 in FIG. 22 correspond to time point t11 to time point t16 in FIG. 11, respectively.

In order to normally operate the shift register constituting the emission driver 220, it is necessary to hold the potential of the first control node VD at the high level throughout the output stop period for the light-emission control clock signals ECK1 to ECK4. Hence it is necessary to prevent charge leakage from the first control node VD. In this regard, according to the configuration illustrated in FIG. 10, there is a concern that a charge leaks from the first control node VD via the transistors M11, M12 particularly when the transistors M11, M12 have a depletion characteristic. Therefore, in the present embodiment, the threshold voltages of the transistors M11, M12 in the unit circuit 22 are made larger than 0 V.

3.4 Effects

Similarly to the first embodiment, in the present embodiment as well, the display control circuit 40 stops the outputs of the light-emission control clock signals ECK1 to ECK4 through the integration period P14. Thus, each light-emission control signal is maintained at a constant level throughout the integration period P14, and coupling noise due to the presence of a parasitic capacitance between the light-emission control line EM in the non-monitoring row and the data signal line SL does not occur during the integration period P14. From the above, in the organic EL display device having the external compensation function, the degradation of the compensation accuracy caused by the coupling noise generated in the data signal line SL is prevented. In addition, since the threshold voltages of the transistors M11, M12 in the unit circuit 22 are larger than 0 V, the charge leakage from the first control node VD is prevented, and the occurrence of abnormal operation of the shift register constituting the emission driver 220 is prevented.

3.5. Modifications

Figure 23:
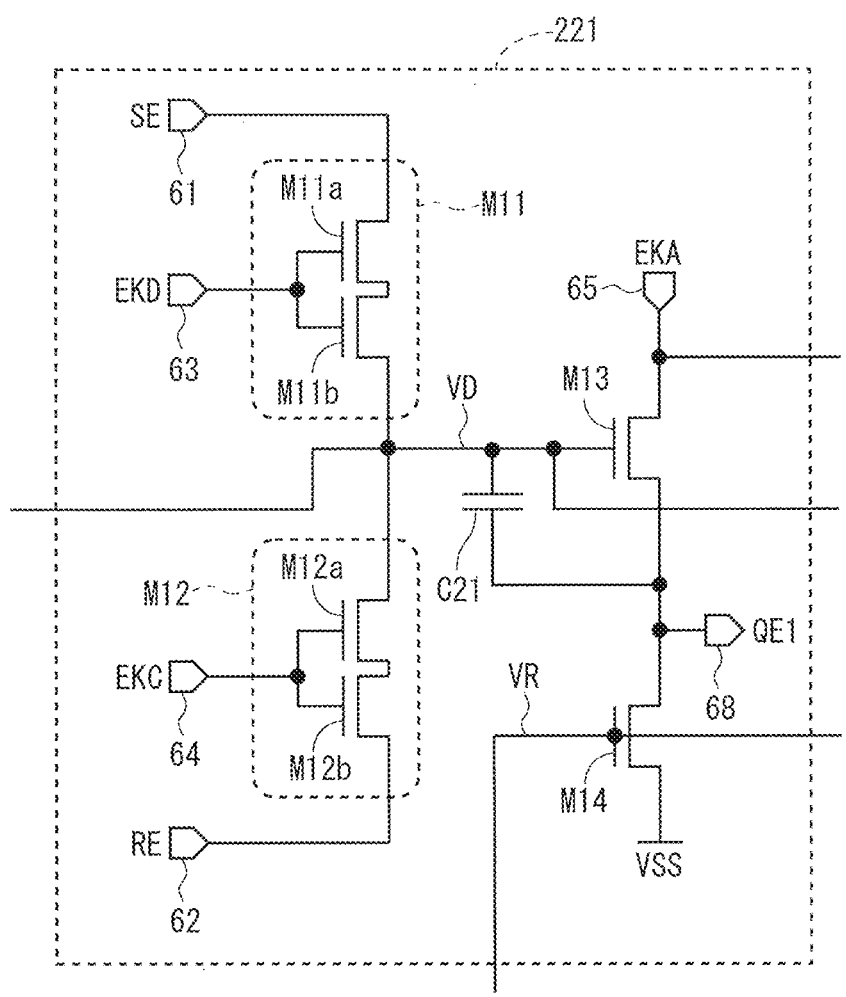
FIG. 23 is a circuit diagram illustrating a configuration of a set circuit included in a unit circuit in a shift register constituting an emission driver in a modification of the third embodiment.
Figure 24:
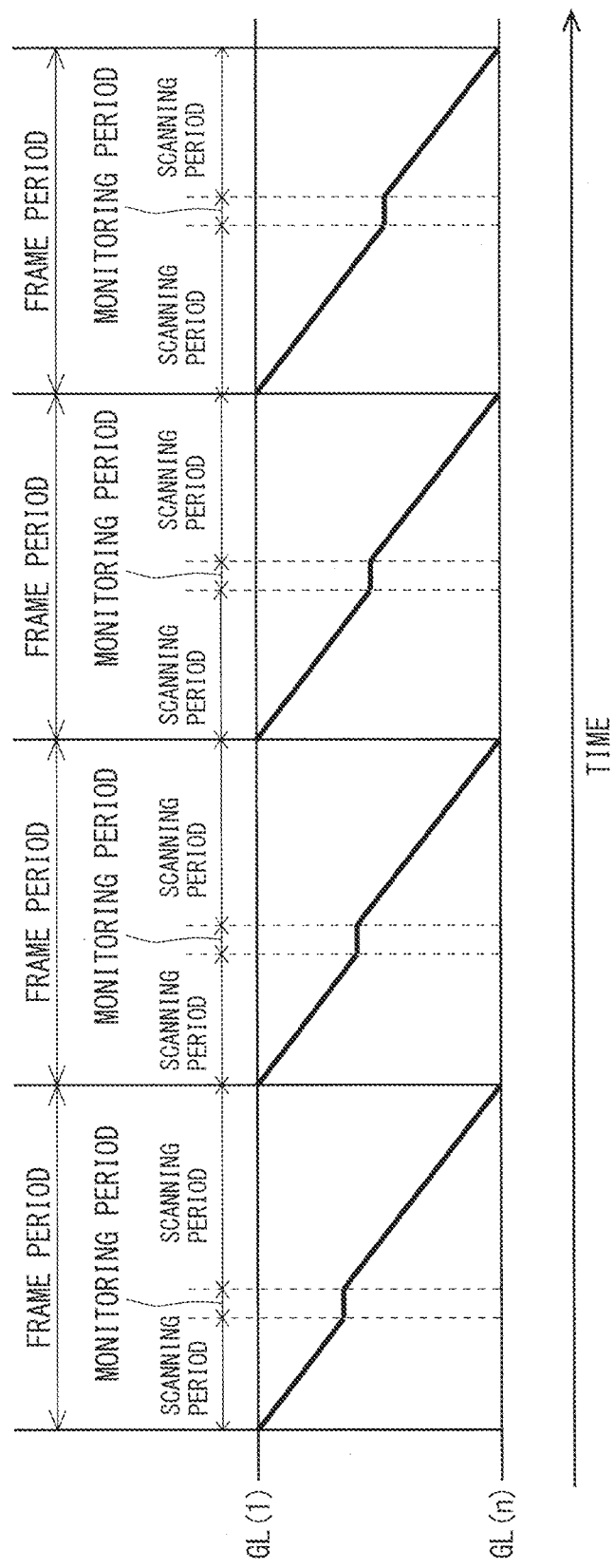
FIG. 24 is a diagram for explaining a real-time monitoring regarding the related art.
Figure 25:
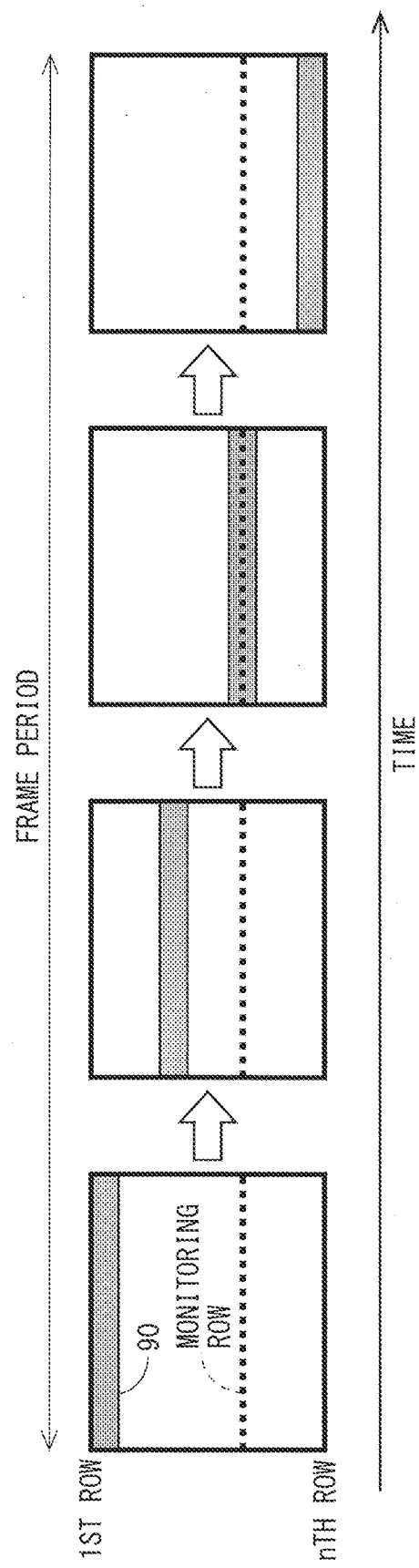
FIG. 25 is a diagram schematically illustrating a shift of a light-off range during a frame period regarding the related art.

In the third embodiment, in order to prevent the charge leakage from the first control node VD in the unit circuit 22 during the output stop period for the light-emission control clock signals ECK1 to ECK4, the threshold voltages of the transistors M11, M12 in the unit circuit 22 are set to be larger than 0 V. However, it is not limited to this. Adopting, as the transistors M11, M12, a thin-film transistor having a double gate structure as illustrated in FIG. 23 also makes it possible to prevent the charge leakage from the first control node VD.

4. Others

In each of the above embodiments (including the modification), the organic EL display device has been described as an example of the display device provided with the pixel circuit including the display element driven by the current, but it is not limited to this. For example, the present disclosure can also be applied to an inorganic EL display device provided with a pixel circuit including an inorganic light-emitting diode, a quantum dot light-emitting diode (QLED) display device provided with a pixel circuit including a quantum dot light-emitting diode, and the like.

DESCRIPTION OF REFERENCE CHARACTERS

10: DISPLAY UNIT
20: SCAN DRIVER
30: SOURCE DRIVER
31: A/D CONVERTER
32: CORRECTION calculation unit
33: CORRECTION DATA STORAGE UNIT
40: DISPLAY CONTROL CIRCUIT
110: PIXEL CIRCUIT
210: GATE DRIVER
220: EMISSION DRIVER
310: DATA SIGNAL LINE DRIVE UNIT
320: CURRENT MONITORING UNIT
GL, GL(1) to GL(n): SCANNING SIGNAL LINE
ML, ML(1) to ML(n): MONITORING CONTROL LINE EM, EM(1) to EM(m): LIGHT-EMISSION CONTROL LINE
SL, SL(1) to SL(m): DATA SIGNAL LINE
L1: ORGANIC EL ELEMENT
T1: WRITE CONTROL TRANSISTOR
T2: DRIVE TRANSISTOR
T3: MONITORING CONTROL TRANSISTOR
T4: LIGHT-EMISSION CONTROL TRANSISTOR

The invention claimed is:

1. A display device including a pixel circuit including a display element that is driven by a current and a drive transistor that controls a drive current of the display element, the display device having a function to perform a monitoring process that is a series of processes to measure, outside the pixel circuit, a current corresponding to a characteristic of the drive transistor and flowing in the pixel circuit, the display device comprising:
    a display unit including a plurality of data signal lines, a plurality of scanning signal lines, and a plurality of light-emission control lines, the plurality of light-emission control lines corresponding to the plurality of scanning signal lines on a one-to-one basis and being disposed to intersect with the plurality of data signal lines;
    a data signal line drive circuit configured to apply a data signal to each of the plurality of data signal lines;
    a scanning signal line drive circuit configured to apply a scanning signal to each of the plurality of scanning signal lines;
    a light-emission control line drive circuit configured to apply a light-emission control signal to each of the plurality of light-emission control lines, the light-emission control line drive circuit including a shift register formed of a plurality of unit circuits corresponding to the plurality of light-emission control lines on a one-to-one basis; and
    a control circuit configured to control operations of the data signal line drive circuit, the scanning signal line drive circuit, and the light-emission control line drive circuit,
    wherein
    the pixel circuit is provided correspondingly to each of intersections of the plurality of data signal lines and the plurality of scanning signal lines,
    the data signal line drive circuit has a function to measure the current corresponding to the characteristic of the drive transistor,
    the shift register generates a light-emission control signal to be applied to each of the light-emission control lines while transferring a light-emission control start pulse signal outputted from the control circuit from a first-stage unit circuit to a last-stage unit circuit on a basis of a plurality of light-emission control clock signals outputted from the control circuit,
    a monitoring period in which the monitoring process is performed includes a measurement write period, in which a data signal for allowing the current corresponding to the characteristic of the drive transistor to flow is written to the pixel circuit, and a current measurement period, in which the current corresponding to the characteristic of the drive transistor is measured by the data signal line drive circuit,
    the control circuit stops outputs of the plurality of light-emission control clock signals throughout the current measurement period, and
    the control circuit simultaneously stops the outputs of the plurality of light-emission control clock signals at a start point of the current measurement period.

2. The display device according to claim 1, wherein
    each of the plurality of data signal lines is also used as a signal line for allowing the current corresponding to the characteristic of the drive transistor to flow during the monitoring process, and
    in the current measurement period, the data signal line drive circuit measures a current flowing through the data signal line.

3. The display device according to claim 1, wherein
    the display unit includes a plurality of monitoring control lines corresponding to the plurality of scanning signal lines on a one-to-one basis, and
    the scanning signal line drive circuit applies a monitoring control signal to each of the plurality of monitoring control lines.

4. The display device according to claim 3, wherein the pixel circuit includes
    the display element having a first terminal and a second terminal,
    the drive transistor having a control terminal, a first conduction terminal, and a second conduction terminal,
    a write control transistor having a control terminal connected to a corresponding scanning signal line, a first conduction terminal connected to a corresponding data signal line, and a second conduction terminal connected to the control terminal of the drive transistor,
    a monitoring control transistor having a control terminal connected to a corresponding monitoring control line, a first conduction terminal connected to the second conduction terminal of the drive transistor, and a second conduction terminal connected to a corresponding data signal line,
    a light-emission control transistor having a control terminal connected to a corresponding light-emission control line, a first conduction terminal connected to the second conduction terminal of the drive transistor, and a second conduction terminal connected to the first terminal of the display element, and
    a capacitive element having one end connected to the control terminal of the drive transistor in order to hold a potential of the control terminal of the drive transistor.

5. The display device according to claim 4, wherein the light-emission control line drive circuit applies the light-emission control signal to each of the plurality of light-emission control lines such that a light-emission control transistor in a pixel circuit included in a row subjected to the monitoring process is maintained in an off-state throughout the monitoring period.

6. A display device including a pixel circuit including a display element that is driven by a current and a drive transistor that controls a drive current of the display element, the display device having a function to perform a monitoring process that is a series of processes to measure, outside the pixel circuit, a current corresponding to a characteristic of the drive transistor and flowing in the pixel circuit, the display device comprising:
    a display unit including a plurality of data signal lines, a plurality of scanning signal lines, and a plurality of light-emission control lines, the plurality of light-emission control lines corresponding to the plurality of scanning signal lines on a one-to-one basis and being disposed to intersect with the plurality of data signal lines;

a data signal line drive circuit configured to apply a data signal to each of the plurality of data signal lines;

a scanning signal line drive circuit configured to apply a scanning signal to each of the plurality of scanning signal lines;

a light-emission control line drive circuit configured to apply a light-emission control signal to each of the plurality of light-emission control lines, the light-emission control line drive circuit including a shift register formed of a plurality of unit circuits corresponding to the plurality of light-emission control lines on a one-to-one basis;

a control circuit configured to control operations of the data signal line drive circuit, the scanning signal line drive circuit, and the light-emission control line drive circuit;

a pattern storage unit configured to hold a plurality of patterns that define an order in which the monitoring process for a plurality of rows is performed; and a random number generation circuit configured to generate a first random number sequence for determining a generation order of the plurality of patterns and a second random number sequence for sorting the generation order of the plurality of patterns, wherein, the pixel circuit is provided correspondingly to each of intersections of the plurality of data signal lines and the plurality of scanning signal lines, the data signal line drive circuit has a function to measure the current corresponding to the characteristic of the drive transistor, the shift register generates a light-emission control signal to be applied to each of the light-emission control lines while transferring a light-emission control start pulse signal outputted from the control circuit from a first-stage unit circuit to a last-stage unit circuit on a basis of a plurality of light-emission control clock signals outputted from the control circuit, a monitoring period in which the monitoring process is performed includes a measurement write period, in which a data signal for allowing the current corresponding to the characteristic of the drive transistor to flow is written to the pixel circuit, and a current measurement period, in which the current corresponding to the characteristic of the drive transistor is measured by the data signal line drive circuit, the control circuit stops outputs of the plurality of light-emission control clock signals throughout the current measurement period, and after the monitoring process is performed in accordance with a generation order of the plurality of patterns determined on a basis of the first random number sequence, the monitoring process is performed in accordance with a generation order of the plurality of patterns obtained by sorting based on the second random number sequence.

7. The display device according to claim 6, wherein the control circuit sequentially stops the outputs of the plurality of light-emission control clock signals one by one, by a start point of the current measurement period.

8. The display device according to claim 6, wherein each of the plurality of data signal lines is also used as a signal line for allowing the current corresponding to the characteristic of the drive transistor to flow during the monitoring process, and in the current measurement period, the data signal line drive circuit measures a current flowing through the data signal line.

9. The display device according to claim 6, wherein the display unit includes a plurality of monitoring control lines corresponding to the plurality of scanning signal lines on a one-to-one basis, and the scanning signal line drive circuit applies a monitoring control signal to each of the plurality of monitoring control lines.

10. The display device according to claim 9, wherein the pixel circuit includes the display element having a first terminal and a second terminal, the drive transistor having a control terminal, a first conduction terminal, and a second conduction terminal, a write control transistor having a control terminal connected to a corresponding scanning signal line, a first conduction terminal connected to a corresponding data signal line, and a second conduction terminal connected to the control terminal of the drive transistor, a monitoring control transistor having a control terminal connected to a corresponding monitoring control line, a first conduction terminal connected to the second conduction terminal of the drive transistor, and a second conduction terminal connected to a corresponding data signal line, a light-emission control transistor having a control terminal connected to a corresponding light-emission control line, a first conduction terminal connected to the second conduction terminal of the drive transistor, and a second conduction terminal connected to the first terminal of the display element, and a capacitive element having one end connected to the control terminal of the drive transistor in order to hold a potential of the control terminal of the drive transistor.

11. The display device according to claim 10, wherein the light-emission control line drive circuit applies the light-emission control signal to each of the plurality of light-emission control lines such that a light-emission control transistor in a pixel circuit included in a row subjected to the monitoring process is maintained in an off-state throughout the monitoring period.

12. A display device including a pixel circuit including a display element that is driven by a current and a drive transistor that controls a drive current of the display element, the display device having a function to perform a monitoring process that is a series of processes to measure, outside the pixel circuit, a current corresponding to a characteristic of the drive transistor and flowing in the pixel circuit, the display device comprising:

a display unit including a plurality of data signal lines, a plurality of scanning signal lines, and a plurality of light-emission control lines, the plurality of light-emission control lines corresponding to the plurality of scanning signal lines on a one-to-one basis and being disposed to intersect with the plurality of data signal lines;

a data signal line drive circuit configured to apply a data signal to each of the plurality of data signal lines;

a scanning signal line drive circuit configured to apply a scanning signal to each of the plurality of scanning signal lines;

a light-emission control line drive circuit configured to apply a light-emission control signal to each of the plurality of light-emission control lines, the light-emission control line drive circuit including a shift register formed of a plurality of unit circuits corresponding to the plurality of light-emission control lines on a one-to-one basis; and a control circuit configured to control operations of the data signal line drive circuit, the scanning signal line drive circuit, and the light-emission control line drive circuit;

wherein, the pixel circuit is provided correspondingly to each of intersections of the plurality of data signal lines and the plurality of scanning signal lines, the data signal line drive circuit has a function to measure the current corresponding to the characteristic of the drive transistor, the shift register generates a light-emission control signal to be applied to each of the light-emission control lines while transferring a light-emission control start pulse signal outputted from the control circuit from a first-stage unit circuit to a last-stage unit circuit on a basis of a plurality of light-emission control clock signals outputted from the control circuit, a monitoring period in which the monitoring process is performed includes a measurement write period, in which a data signal for allowing the current corresponding to the characteristic of the drive transistor to flow is written to the pixel circuit, and a current measurement period, in which the current corresponding to the characteristic of the drive transistor is measured by the data signal line drive circuit, the control circuit stops outputs of the plurality of light-emission control clock signals throughout the current measurement period, and each of the plurality of unit circuits includes:
 a first control node,
 a first output terminal connected to a unit circuit in a subsequent stage,
 a second output terminal connected to a corresponding light-emission control line,
 a first output control transistor having a control terminal connected to the first control node, a first conduction terminal to which one of the plurality of light-emission control clock signals is provided, and a second conduction terminal connected to the first output terminal,
 a second output control transistor having a control terminal connected to the first control node, a first conduction terminal to which an on-level power supply voltage is applied, and a second conduction terminal connected to the second output terminal,
 a first control node set transistor having a control terminal to which one of the plurality of light-emission control clock signals is provided, a first conduction terminal to which a set signal is provided, and a second conduction terminal connected to the first control node,
 a first control node reset transistor having a control terminal to which one of the plurality of light-emission control clock signals is provided, a first conduction terminal connected to the first control node, and a second conduction terminal to which a reset signal is provided, and
 a first boost capacitance having one end connected to the first control node and the other end connected to the first output terminal.

13. The display device according to claim 12, wherein threshold voltages of the first control node set transistor and the first control node reset transistor are larger than 0 V.

14. The display device according to claim 12, wherein the first control node set transistor and the first control node reset transistor are thin-film transistors having a double gate structure.

15. The display device according to claim 12, wherein each of the plurality of unit circuits includes
 a second control node,
 a third control node,
 an internal control transistor having a control terminal connected to the second control node, a first conduction terminal to which one of the plurality of light-emission control clock signals is provided, and a second conduction terminal connected to the third control node,
 a second control node set transistor having a control terminal to which one of the plurality of light-emission control clock signals is provided, a first conduction terminal to which an on-level power supply voltage is applied, and a second conduction terminal connected to the second control node,
 a second control node reset transistor having a control terminal connected to the first control node, a first conduction terminal connected to the second control node, and a second conduction terminal to which one of the plurality of light-emission control clock signals is provided,
 a third control node reset transistor having a control terminal to which one of the plurality of light-emission control clock signals is provided, a first conduction terminal connected to the third control node, and a second conduction terminal to which an off-level power supply voltage is applied, and
 a second boost capacitance having one end connected to the second control node and the other end connected to the third control node.

16. The display device according to claim 12, wherein the control circuit sequentially stops the outputs of the plurality of light-emission control clock signals one by one, by a start point of the current measurement period.

17. The display device according to claim 12, wherein
 each of the plurality of data signal lines is also used as a signal line for allowing the current corresponding to the characteristic of the drive transistor to flow during the monitoring process, and
 in the current measurement period, the data signal line drive circuit measures a current flowing through the data signal line.

18. The display device according to claim 12, wherein
 the display unit includes a plurality of monitoring control lines corresponding to the plurality of scanning signal lines on a one-to-one basis, and
 the scanning signal line drive circuit applies a monitoring control signal to each of the plurality of monitoring control lines.

19. The display device according to claim 18, wherein the pixel circuit includes
 the display element having a first terminal and a second terminal,
 the drive transistor having a control terminal, a first conduction terminal, and a second conduction terminal,
 a write control transistor having a control terminal connected to a corresponding scanning signal line, a first conduction terminal connected to a corresponding data signal line, and a second conduction terminal connected to the control terminal of the drive transistor,
 a monitoring control transistor having a control terminal connected to a corresponding monitoring control line, a first conduction terminal connected to the second conduction terminal of the drive transistor, and a second conduction terminal connected to a corresponding data signal line, a light-emission control transistor having a control terminal connected to a corresponding light-emission control line, a first conduction terminal connected to the second conduction terminal of the drive transistor, and a second conduction terminal connected to the first terminal of the display element, and a capacitive element having one end connected to the control terminal of the drive transistor in order to hold a potential of the control terminal of the drive transistor.

20. The display device according to claim 19, wherein the light-emission control line drive circuit applies the light-emission control signal to each of the plurality of light-emission control lines such that a light-emission control transistor in a pixel circuit included in a row subjected to the monitoring process is maintained in an off-state throughout the monitoring period.

* * * * *